(12) United States Patent
Nauman et al.

(10) Patent No.: US 9,039,871 B2
(45) Date of Patent: May 26, 2015

(54) METHODS AND APPARATUS FOR APPLYING PERIODIC VOLTAGE USING DIRECT CURRENT

(75) Inventors: Kenneth E. Nauman, Fort Collins, CO (US); Kenneth Finley, Mead, CO (US); Skip B. Larson, Fort Collins, CO (US); Doug Pelleymounter, Northfield, MN (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 1051 days.

(21) Appl. No.: 13/104,942

(22) Filed: May 10, 2011

(65) Prior Publication Data

US 2011/0248633 A1 Oct. 13, 2011

Related U.S. Application Data

(63) Continuation of application No. 11/941,548, filed on Nov. 16, 2007, now Pat. No. 8,133,359.

(60) Provisional application No. 61/333,721, filed on May 11, 2010.

(51) Int. Cl.
*C23C 14/34* (2006.01)
*H01J 37/34* (2006.01)
(Continued)

(52) U.S. Cl.
CPC .............. *C23C 14/54* (2013.01); *C23C 14/3485* (2013.01); *C23C 14/3492* (2013.01); *C23C 14/542* (2013.01); *C23C 14/548* (2013.01); *C23C 14/564* (2013.01); *H01J 37/34* (2013.01);
(Continued)

(58) Field of Classification Search
CPC ............. C23C 14/3485; C23C 14/3492; H01J 37/3444; H01J 37/3464; H01J 37/3467
USPC ........................................ 204/192.12, 298.08
See application file for complete search history.

(56) References Cited

U.S. PATENT DOCUMENTS

| | | | |
|---|---|---|---|
| 4,595,482 A | 6/1986 | Mintz | |
| 5,015,493 A | 5/1991 | Gruen | |

(Continued)

FOREIGN PATENT DOCUMENTS

| | | |
|---|---|---|
| DE | 3538494 | 7/1987 |
| JP | 2001-505622 A | 4/2001 |

(Continued)

OTHER PUBLICATIONS

Gruber, Stephen S., "Response to Chinese Office Action re Application No. 200880123933.2", Mar. 21, 2013, p. 13, Published in: US.

(Continued)

*Primary Examiner* — Rodney McDonald
(74) *Attorney, Agent, or Firm* — Neugeboren O'Dowd PC

(57) ABSTRACT

Methods and apparatus for applying pulsed DC power to a plasma processing chamber are disclosed. In some implementations, frequency of the applied power is varied to achieve desired processing effects such as deposition rate, arc rate, and film characteristics. In addition, a method and apparatus are disclosed that utilize a relatively high potential during a reverse-potential portion of a particular cycle to mitigate possible nodule formation on the target. The relative durations of the reverse-potential portion, a sputtering portion, and a recovery portion of the cycle are adjustable to effectuate desired processing effects.

4 Claims, 20 Drawing Sheets

(51) Int. Cl.
  *C23C 14/54* (2006.01)
  *C23C 14/56* (2006.01)
  *H05H 1/46* (2006.01)

(52) U.S. Cl.
  CPC ......... *H01J 37/3417* (2013.01); *H01J 37/3429* (2013.01); *H01J 37/3438* (2013.01); *H01J 37/3444* (2013.01); *H01J 37/3467* (2013.01); *H05H 1/46* (2013.01); *H05H 2001/4682* (2013.01)

(56) References Cited

U.S. PATENT DOCUMENTS

| | | |
|---|---|---|
| 5,303,139 A | 4/1994 | Mark |
| 5,383,980 A | 1/1995 | Melber et al. |
| 5,427,669 A | 6/1995 | Drummond |
| 5,576,939 A | 11/1996 | Drummond |
| 5,651,865 A | 7/1997 | Sellers |
| 5,660,700 A * | 8/1997 | Shimizu et al. ......... 204/298.08 |
| 5,681,393 A | 10/1997 | Takagi |
| 5,718,813 A | 2/1998 | Drummond et al. |
| 5,777,863 A | 7/1998 | Kowalevskii et al. |
| 5,855,745 A | 1/1999 | Manley |
| 5,917,286 A | 6/1999 | Scholl et al. |
| 6,001,224 A | 12/1999 | Drummond |
| 6,005,218 A | 12/1999 | Walde et al. |
| 6,007,879 A | 12/1999 | Scholl |
| 6,024,844 A | 2/2000 | Drummond et al. |
| 6,051,114 A | 4/2000 | Yao et al. |
| 6,063,245 A | 5/2000 | Frach et al. |
| 6,093,293 A | 7/2000 | Haag et al. |
| 6,171,454 B1 | 1/2001 | Weber et al. |
| 6,217,717 B1 | 4/2001 | Drummond et al. |
| 6,222,321 B1 | 4/2001 | Scholl et al. |
| 6,338,777 B1 | 1/2002 | Longstreth White |
| 6,340,416 B1 | 1/2002 | Goedicke et al. |
| 6,344,419 B1 | 2/2002 | Forster et al. |
| 6,350,353 B2 | 2/2002 | Gopalraja et al. |
| 6,359,424 B2 | 3/2002 | Iida et al. |
| 6,368,477 B1 | 4/2002 | Scholl |
| 6,413,382 B1 | 7/2002 | Wang et al. |
| 6,521,099 B1 | 2/2003 | Drummond et al. |
| 6,522,076 B2 | 2/2003 | Goedicke et al. |
| 6,527,918 B2 | 3/2003 | Goeckner et al. |
| 6,532,161 B2 | 3/2003 | Kovalevskii et al. |
| 6,567,278 B2 | 5/2003 | Rufer et al. |
| 6,582,566 B2 | 6/2003 | List et al. |
| 6,633,017 B1 | 10/2003 | Drummond et al. |
| 6,735,099 B2 | 5/2004 | Mark |
| 6,808,607 B2 | 10/2004 | Christie |
| 6,853,142 B2 | 2/2005 | Chistyakov |
| 6,863,785 B2 | 3/2005 | Shidoji et al. |
| 6,872,289 B2 | 3/2005 | Mizuno et al. |
| 7,247,221 B2 | 7/2007 | Stowell, Jr. |
| 7,678,239 B2 | 3/2010 | Haag et al. |
| 8,133,359 B2 | 3/2012 | Nauman et al. |
| 2002/0189938 A1 | 12/2002 | Baldwin et al. |
| 2003/0209423 A1 | 11/2003 | Christie |
| 2005/0006226 A1 | 1/2005 | Baldwin et al. |
| 2005/0103620 A1 | 5/2005 | Chistakov |
| 2005/0167263 A1 | 8/2005 | Chistyakov |
| 2006/0016560 A1 | 1/2006 | Yokogawa et al. |
| 2006/0027451 A1 | 2/2006 | Park et al. |
| 2006/0278518 A1 | 12/2006 | Kouznetsov |
| 2006/0279223 A1 | 12/2006 | Chistyakov |
| 2009/0127101 A1 | 5/2009 | Nauman et al. |
| 2011/0248633 A1 | 10/2011 | Nauman et al. |
| 2012/0171390 A1 | 7/2012 | Nauman et al. |

FOREIGN PATENT DOCUMENTS

| | | |
|---|---|---|
| JP | 2006-117995 | 5/2006 |
| JP | 2006-249473 A | 9/2006 |
| JP | 2006-299412 A | 11/2006 |
| JP | 2007-277638 | 10/2007 |
| KR | 1020060052883 | 5/2006 |
| WO | 9416458 | 7/1994 |
| WO | 9423440 | 10/1994 |
| WO | 9631899 | 10/1996 |
| WO | 9742647 | 11/1997 |
| WO | 2004106582 A2 | 9/2004 |
| WO | 2011143331 A1 | 11/2011 |

OTHER PUBLICATIONS

Shusaku Yamamoto, "Response to Japanese Office Action re Application No. 2010-534232", Feb. 18, 2013, p. 17, Published in: JP.

Korean Intellectual Property Office, "Korean Office Action re Appl No. 10-2010-7011346", Jun. 2, 2014, p. 17, Published in: KR.

McDonald, Rodney Glenn, "Office Action re U.S. Appl. No. 13/417,937", Jun. 3, 2014, p. 43, Published in: US.

McDonald, Rodney Glenn, "Office Action re U.S. Appl. No. 13/417,937", Jun. 4, 2013, p. 30, Published in: US.

Gruber, Stephen S., "Response to Office Action re U.S. Appl. No. 13/417,937", Mar. 26, 2013, p. 7, Published in: US.

Gruber, Stephen S., "Response to Office Action re U.S. Appl. No. 13/417,937", Jul. 31, 2013, p. 7, Published in: US.

McDonald, Rodney Glen, "Office Action re U.S. Appl. No. 11/941,548", May 4, 2011, Published in: US.

Korean Intellectual Property Office, "International Search Report and Written Opinion re Application No. PCT/US08/83640", Jun. 26, 2009, Published in: KR.

Williams, James, "International Search Report and Written Opinion re Application No. PCT/US11/036100", Aug. 2, 2011, Published in: AU.

Carniglia, C.K., "Method for Calculating the Sputter Distribution from a C-MAG Cylindrical Target in the Presence of Gas Scattering", "39th Annual Technical Conference Proceedings", 1996, pp. 211-216, Publisher: Society of Vacuum Coaters, Published in: US.

Glaser, H.J., et al., "History of Glass Coating for Architectural Glazing", "50th Annual Technical Conference Proceedings", 2007, pp. 216-229, Publisher: Society of Vacuum Coaters, Published in: US.

Heister, U., et al., "New Developments in the Field of MF-Sputtering with Dual Magnetron to Obtain Higher Productivity for Large Area Coatings", "41st Annual Technical Conference Proceedings", 1998, pp. 187-192, Publisher: Society of Vacuum Coaters, Published in: US.

Madocks, J., et al., "The Economic Advantages of Gap Reduction for an Architectural Glass Coater", "43rd Annual Technical Conference Proceedings Denver, Apr. 15-20, 2000", pp. 133-136, Publisher: Society of Vacuum Coaters, Published in: US.

McDonald, Rodney Glenn, "Office Action in related U.S. Appl. No. 11/941,548", Oct. 4, 2011, p. 17, Published in: US.

Schilling, H., "A New Plant Generation for Large Area Vacuum Coating of Architectural and Automotive Glass", "42nd Annual Technical Conference Proceedings", 1999, pp. 186-190, Publisher: Society of Vacuum Coaters, Published in: US.

CIPO, Office Action re Chinese Patent Application No. 200880123933.2, Jul. 3, 2012, p. 7, Published in: CN.

CIPO, Office Action re Chinese Patent Application No. 200880123933.2, Oct. 10, 2011, p. 19, Published in: CN.

CIPO, Office Action re Chinese Patent Application No. 200880123933.2, Dec. 27, 2012, p. 6, Published in: CN.

Gruber, Stephen S., Response to Office Action dated Oct. 10, 2011 re Chinese Patent Application No. 200880123933.2, Feb. 23, 2012, p. 10, Published in: US.

Gruber, Stephen S., Response to Office Action dated Jul. 3, 2012 re Chinese Patent Application No. 200880123993.2, Aug. 31, 2012, p. 6, Published in: US.

Swiatek, R., Communication re European Search Report regarding Application No. 08850815.5, Jun. 28, 2012, p. 9, Published in: DE.

Ayusawa, T., Office Action re Japanese Patent Application No. 2010-534232, Nov. 27, 2012, p. 8, Published in: JP.

(56) References Cited

OTHER PUBLICATIONS

McDonald, Rodney Glenn, Office Action re U.S. Appl. No. 11/941,548, Dec. 2, 2011, p. 23, Published in: US.

McDonald, Rodney Glenn, Office Action re U.S. Appl. No. 13/417,937, Dec. 26, 2012, p. 13, Published in: US.

Becamel, Philippe, International Preliminary Report on Patentability re Application No. PCT/US11/36100, Nov. 22, 2012, p. 6, Published in: PCT.

Gruber, Stephen S., Response to Office Action dated May 4, 2011 re U.S. Appl. No. 11/941,548, Oct. 4, 2011, p. 14, Published in: US.

O'Dowd, Sean R., Response to Office Action dated Dec. 2, 2011 re U.S. Appl. No. 11/941,548, Dec. 8, 2011, p. 9, Published in: US.

Korean Intellectual Property Office, "Korean Office Action re Application No. 10-2012-7031226", Sep. 30, 2014, p. 8, Published in: KR.

* cited by examiner

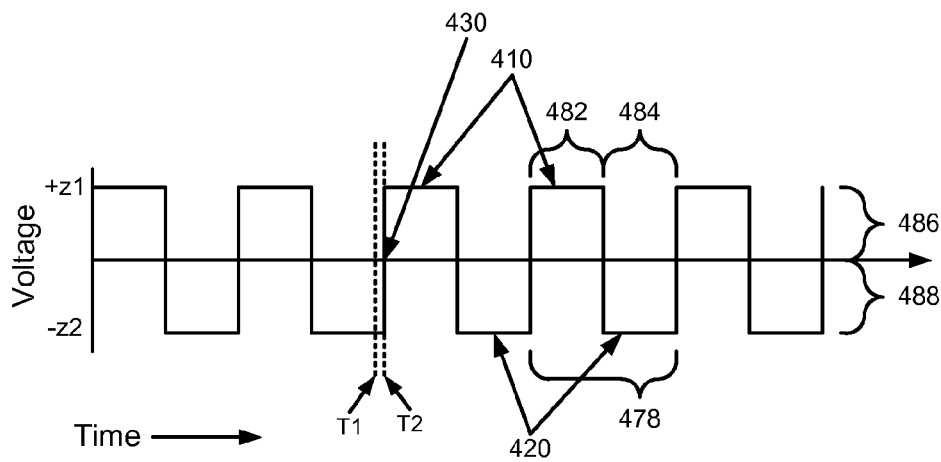
FIG. 4
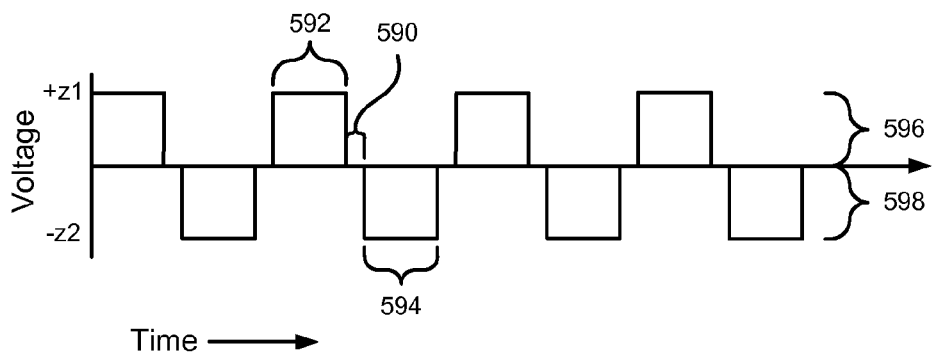
FIG. 5
| Pulse Parameter 620 | Pulse Parameter Values 630 |
|---|---|
| Pulse Power | 100 kW |
| Off-time | 5 microseconds |
| Pulse Duration (width) | 100 milliseconds |
| Voltage | 500 Volts |
| Cycle Time | 200.010 milliseconds |
| Polarity | Positive |
FIG. 6

METHODS AND APPARATUS FOR APPLYING PERIODIC VOLTAGE USING DIRECT CURRENT

This application is a continuation of Ser. No. 11/941,548 now U.S. Pat. No. 8,133,359.

FIELD OF THE INVENTION

The present invention relates to plasma-based sputtering deposition. In particular, but not by way of limitation, the present invention relates to methods and apparatus for plasma-based processing using a direct current power supply.

BACKGROUND OF THE INVENTION

Plasma processing techniques have found wide-spread use in industry for commercial processes such as plasma vapor deposition, sputtering, and so forth. These processes have become particularly useful in thin film applications. To generate plasma, a power supply creates an electric potential between a cathode and one or more anodes that are placed in a plasma chamber containing the process gases that form the plasma. When using these processes for deposition, the plasma acts upon the material of a target (also referred to as a sputtering source) placed in the plasma chamber that normally comprises the cathode surface. Plasma ions are accelerated towards the target and cause target material to be dislodged from the cathode surface on impact. The dislodged target material is then deposited on a substrate to form a film (e.g., thin film). The film may constitute material sputtered by the plasma from the target surface, as disclosed above, or may be the result of a reaction between the target material and some other element included in the plasma or process gases.

High frequency voltage sources (e.g., alternating-current (AC) power sources) have been used to generate a high electrical potential that produces a plasma within a plasma chamber. These high-frequency voltage sources are expensive to construct and maintain, as well as complicated to operate. Additionally, if the deposition material is formed by reaction with an element in the plasma or process gases, and further, is electronically insulating, the anode in the chamber can be coated with the insulator; this deposit can then prevent the anode from performing its function of collecting electrons from the plasma during the deposition process.

To overcome the disadvantages associated with high frequency voltage sources, alternating pulsed direct current power sources have been employed in anodeless dual magnetron-type systems such as that disclosed in U.S. Pat. No. 5,917,286, which is incorporated herein by reference in its entirety. The process of reversing polarities allows the electrodes to alternately act as an anode and as a cathode, and the sputtering process that occurs during the cathode phase cleans off any deposited insulating material and permits uninhibited operation of the electrode as an anode during the anode phase. Additionally, the process of reversing polarities allows both electrodes to alternatively act as a cathode so that both electrode surfaces are capable of providing target material.

Although the present pulsed direct current power sources are functional, they are not sufficiently accurate or otherwise satisfactory in many thin film processing applications to achieve, for example, uniformity and/or particle generation thresholds. Co-sputtering of an arbitrary stoichiometry is also not achievable with standard technology. Accordingly, methods and apparatus are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the invention may be characterized as a method, and means for carrying out the method, for applying pulsed DC power to a plasma processing chamber. The method in these embodiments includes applying a negative potential to a cathode during a sputtering portion of a particular cycle of the pulsed DC power for a first time duration; applying, during a reverse-potential portion of the particular cycle, a positive potential to the cathode that has a magnitude that is at least twenty percent of the magnitude of the negative potential; and applying, during a recovery portion of the particular cycle, a recovery potential for a third time duration that has a magnitude that is less than the magnitude of both the negative potential and the positive potential.

Other embodiments of the invention may be characterized as a power supply including a direct current power source configured to deliver power to a plasma sputtering chamber; a power control component in communication with the direct current power source and configured to direct the power to at least one electrode with an alternating polarity according to processor readable instructions; and a non-transitory, tangible computer readable storage medium, encoded with the processor readable instructions to perform a method for applying power, the method comprising: applying DC power pulses at a desired level of power to an electrode of a plasma processing chamber to sustain a plasma process that deposits a film on a substrate; monitoring an impedance of the plasma, the impedance providing an indication of a status of at least one processing effect; and adjusting, responsive to the monitored impedance, a frequency of the DC power pulses to alter the status of the processing effect.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

FIG. 4 is a graph that illustrates an example of DC power pulses produced by a DC power supply for an electrode of a plasma sputtering chamber, according to an embodiment of the invention;

FIG. 5 is a graph that illustrates a duty cycle that includes a transition time period
that is greater than zero, according to an embodiment of the invention;

FIG. 6 is a table that illustrates an example of pulse parameters and pulse parameter values, according to an embodiment of the invention;

DETAILED DESCRIPTION

Figure 1:
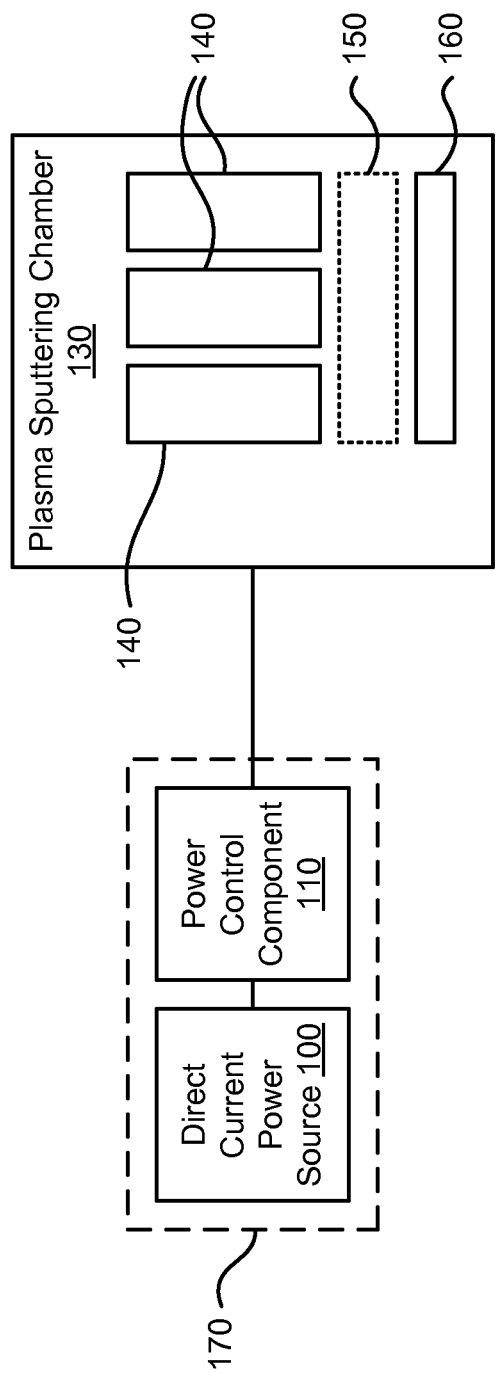
FIG. 1 is a schematic diagram of a direct current (DC) power source, a power control component, and a plasma sputtering chamber, according to an embodiment of the invention.

Referring now to the drawings, where like or similar elements are designated with identical reference numerals throughout the several views, and referring in particular to FIG. 1, it is a block diagram depicting a direct current (DC) power source 100, a power control component 110, and a plasma processing chamber 130, according to an embodiment of the invention. The plasma processing chamber 130 in the exemplary embodiment of FIG. 1 includes two or more electrodes 140 that are each configured to function as an anode and as a cathode (the cathode can be referred to as a sputtering target). The DC power source 100 and power control component 110 can be collectively referred to as a DC power supply 170. It should be recognized, however, that the block diagram of FIG. 1 is merely logical and in some embodiments the power source 100 and the power control component 110 are realized as separate components. In one embodiment for example, the power control component 110 is implemented as an additional component to an existing DC power source.

It should also be recognized that, in alternative modes of operation discussed further herein, there may be only a single electrode 140 within the chamber 130 and the chamber itself may function as an electrode. In addition, although many embodiments are described as operating in the context of sputtering-type processing, it should be recognized that the power control component 110 may also be utilized in connection with PECVD processing (e.g., for gas ionization), substrate biasing (e.g., deposition and etch applications), and ion sources (e.g., as power delivery for an ion source).

In general, the DC power source 100 is configured to supply DC power to the power control component 110. In several embodiments, the DC power source 100 provides power in the range of 20 to 200 Kilowatts, but other power levels are certainly contemplated. And in many embodiments, the DC power source 100 is realized by multiple DC generators that are coupled together. In one embodiment for example, the DC power source is realized by three 50 Kilowatt DC generators to provide a 150 kW power supply.

The plasma 150 is formed from one or more gases, including a noble gas (e.g., argon) or other gaseous species, and may be formed from a chemical compound having a specified composition. In some embodiments, magnetic fields (not shown) are applied within and/or outside of the plasma sputtering chamber 130 (e.g., at locations around the electrodes 140) to promote the ionization of the gas and possibly the direction of plasma ions of the plasma 150 to any of the electrodes 140 and/or the substrate 160.

When plasma 150 is ignited and sustained in response to a voltage potential between electrodes 140, plasma ions are accelerated towards and impact an electrode 140 functioning as a cathode to cause atoms from the electrode 140 to be ejected. In some embodiments, the electrodes 140 are referred to as a target and the atoms (e.g., material) ejected toward the substrate is referred to as target atoms (e.g., target material). In many implementations, the target material includes a metallic substance such as aluminum or a different material such as a ceramic. And is some implementations (e.g., co-sputtering) the target material for each individual electrode 140 may include different material or composition.

Although not required, in many embodiments the DC power source 100 is configured to detect one or more arcs (e.g., micro arc and/or hard arcs) forming within the plasma sputtering chamber 130. An exemplary power supply that is configured with arc-handling capabilities is the ASCENT model DC generator available from Advanced Energy Incorporated in Fort Collins, Colo. In other embodiments, arc detection is carried out by the power control component 110. As one of ordinary skill in the art appreciates, an arc can have a detrimental effect on, for example, the plasma sputtering chamber 130 and/or an object (e.g., semiconductor substrate) within the plasma sputtering chamber 130.

The power control component 110 is generally configured to manage power produced by the DC power source 100 and to provide managed power to the sputtering chamber 130. Specifically, the power control component 110 is configured to manage the power from the DC power source 100 to the electrodes 140 such that a plasma 150 is ignited and/or sustained. In several embodiments for example, the power control component 110 is configured to send DC pulses of power with alternating polarities ("bipolar pulses") to the electrodes 140 such that each of the electrodes 140 operates as a cathode for a period of time and as an anode for a period of time. And in other modes of operation, the power control component 110 provides pulses of power without alternating polarities ("unipolar pulses") so that one or more electrodes 140 operates as a cathode and one or more of the electrodes 140 and/or the chamber 130 functions as an anode.

An advantage of the modes of operation in which alternating polarites of DC pulses are applied to the electrodes by the power control component 110, is flexibility with respect to the spacing of the electrodes because there are effectively no dedicated anodes. As a consequence, these "anodeless" modes of DC sputtering enables electrodes to be located as desired (e.g., to enhance film uniformity and/or to generate plasma where it is desired to be generated within the chamber 130), which in many implementations, reduces sources of contamination and results in a less complicated mechanical system.

Beneficially, the power control component 110 in several embodiments is configured to modulate an amount of power to each of, at least, a portion of the electrodes 140. As a consequence, the power control component 110 in many embodiments enables the amount of target material that is sputtered from one or more of the electrodes to be varied to enable the target material to be deposited on the substrate 160 in a desired manner. For example, in several embodiments, the power to one or more of the electrodes 140 is independently controllable to enable material to be deposited with a desired topology, resistance, strength, etc. Moreover, in many implementations, the power delivered to one or more of the electrodes is modulated responsive to feedback from the plasma chamber 130 (e.g., feedback indicative of a thickness of the deposited layer, resistance of the layer, optical properties of the layer, etc.).

By way of further example, the power control component 110 in many implementations is configured to enable a uniform deposition of target material on the substrate 160 by modulating power to one or more of the electrodes 140 while target material is being deposited on the substrate. Moreover, in some embodiments, the amount of target material remaining on an electrode may be monitored and the power applied to that electrode may be modulated based on the amount of target material remaining so as to enable the amount of target material that is utilized to be maximized without removing unwanted material from the electrode. This is a major benefit because target material is often very expensive and increasing an amount of target material that is used (while avoiding the removal of unwanted material from the electrode) will save a substantial amount of money, and in addition, the time periods between required maintenance may also be increased—again saving time and money—due to less contamination from unwanted removal of electrode material.

In many embodiments, the substrate 160 is held in a static position while material is deposited on the substrate 160. As a consequence, in these static-deposition embodiments, the amount of undesirable particles that become entrained in the plasma 150 due to moving parts is substantially reduced; thus the number of defects that are due to impurities in the layer deposited on the substrate are reduced. Moreover, particle-induced arcing is also reduced, which improves the quality of the processing. In alternative embodiments, the position of the substrate 160 is moved relative to the electrodes to achieve desired deposition characteristics.

Another advantage of many embodiments disclosed herein is the ability to carry out metallic sputtering with DC power (e.g., DC power with an alternating polarity). For example, many embodiments described herein enable metallic sputtering on a static or dynamic substrate utilizing techniques that modulate power to one or more of the electrodes.

In several embodiments, the power control component 110 is configured to trigger the DC pulses of power at frequencies around 0 Hz to 500 kHz. In some embodiments, the power control component 110 operates to provide DC pulses around 2 kKz to 50 kHz, and in other embodiments 10 Hz to 2 kHz, and in other implementations the power control component 110 operates to provide DC pulses around 10 Hz to 500 Hz. In one exemplary embodiment, the power control component delivers DC power pulses at a frequency of 60 Hz, and in yet other embodiments, the power control component 110 operates to provide DC pulses around 10 Hz to 50 Hz. And as discussed further herein, the power control component 110 is configured to provide either bipolar or unipolar pulses at much higher frequencies (e.g., 500 kHz) In many low frequency variations, the pulse width of each of the alternating power pulses is at least longer than the arc detection time of the DC power source 100. In other variations, the power controller 110 includes the arc management functionality to handle higher-frequency implementations.

In some embodiments, the pulse width of each of the bipolar and/or unipolar power pulses is shorter than a thermal time constant associated with one or more of the electrodes 140 to substantially prevent changes in temperature of one or more of the electrodes 140 that could affect deposition (e.g., uniformity, film quality, deposition rates). And in some variations, the pulses have characteristics (e.g., width, frequency, etc.) based on a thermal threshold condition. The thermal threshold condition can be associated with a component associated with the plasma sputtering chamber 130 (e.g., wiring, connectors, etc.) or an electrode 140 associated with the plasma sputtering chamber 130. For example, in some embodiments, the thermal threshold condition is defined to prevent a particular component associated with the plasma sputtering chamber 130 or electrode 140 from exceeding or falling below a specified temperature.

The power control component 110 in many embodiments includes one or more switches (not shown) such as, for example, an insulated gate bipolar transistor (IGBT) and/or a control module (not shown). In some embodiments, the control module includes a control algorithm (e.g., open loop control algorithm or closed loop control algorithm) that is used in conjunction with one or more switches to produce DC power pulses according to pulse parameter values. In some embodiments, the pulse parameter values are accessed from a memory (not shown) associated with the power control component 110 and/or the DC power source 100.

In some embodiments, one or more of the functions of the power control component 110 are incorporated into the DC power source 100, and in other embodiments, one or more of the functions of the DC power source 100 are incorporated into the power control component 110. And in some variations, the modules disclosed herein are implemented by software, firmware and/or hardware that are dynamically modified and/or statically configured.

Figure 2:
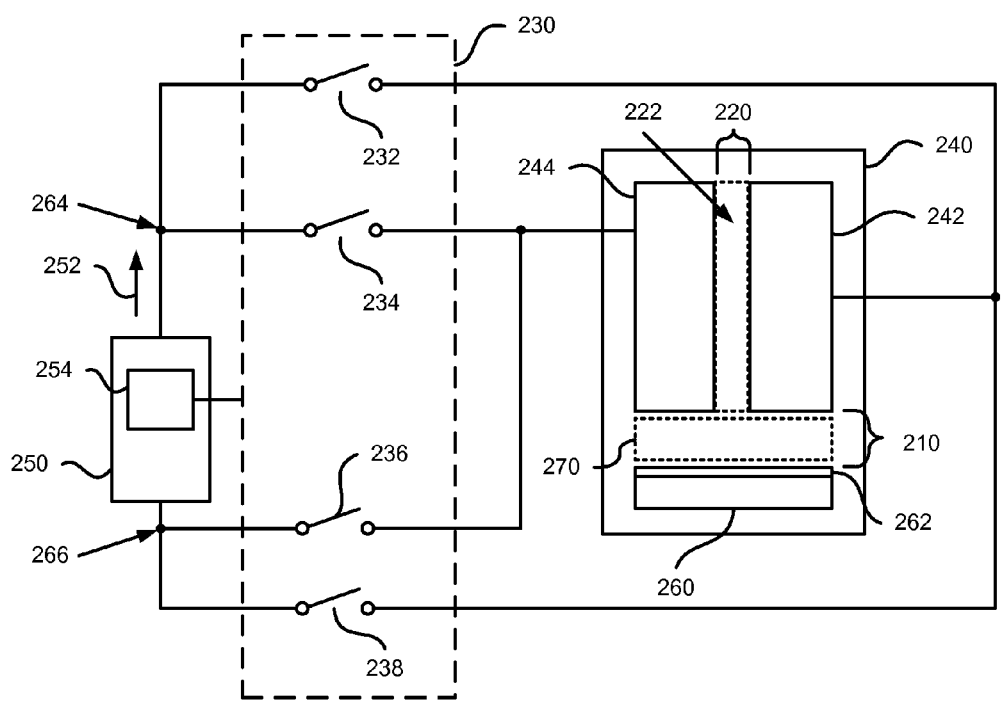
FIG. 2 is a schematic diagram that illustrates a DC power source and a power control component configured to produce DC power pulses at an ultra-low frequency for a plasma sputtering chamber, according to an embodiment of the invention.

Referring next to FIG. 2, it is a schematic diagram that illustrates a DC power source 250 (e.g., current source) and a power control component 230 configured to produce DC power pulses at an ultra-low frequency for a plasma sputtering chamber 240, according to an embodiment of the invention. Specifically, the path of the current 252 to the plasma sputtering chamber 240 is controlled by the power control component 230 to create DC power pulses. The power control component 230 includes switches 232 and 234 that are connected in a parallel configuration to a positive polarity node 264. The power control component 230 also includes switches 236 and 238 that are connected in a parallel configuration to a negative polarity node 266.

Switches 232, 234, 236, and 238 are alternately closed to apply power to electrodes 244 and 242 of the plasma sputtering chamber 240 in an alternating fashion such that a plasma is ignited and/or sustained in a plasma formation region 270. A substrate 260 is disposed within the plasma sputtering chamber 240 so that at least some material dislodged from the electrodes 242 and 244 by the plasma is deposited on the substrate 260 in a deposition layer 262 when the plasma is ignited and/or sustained in the plasma formation region 270. In some embodiments, at least two of the switches 232, 234, 236, and 238 are closed at substantially the same time (e.g., substantially simultaneously). The deposition layer 262, in some embodiments, is a thin-film transistor (TFT) deposition layer, but this is certainly not required and many other applications are contemplated.

By alternating current to the electrodes 242 and 244, one of the electrodes functions as a cathode for a period of time while the other functions as an anode during that period of time. For example, in a first state of operation, switches 232 and 236 are closed while switches 234 and 238 are open such that current flows from the DC power source 250 through electrode 242 and then through electrode 244. In this first state of operation, electrode 242 will be functioning as an anode while electrode 244 will be a functioning as a cathode. A plasma will be ignited and/or sustained in the plasma formation region 270 and the substrate 260 will be coated by material dislodged from electrode 242.

In a second state of operation, switches 234 and 238 are closed while switches 232 and 236 are open such that current flows from the DC power source 250 through electrode 244 and then through electrode 242. In this second state of operation, electrode 242 will be functioning as a cathode while electrode 244 will be a functioning as an anode. A plasma will be ignited and/or sustained in the plasma formation region 270 and the substrate 260 will be coated by material dislodged from electrode 244. In many embodiments, a control module 254 (e.g., a processor executing stored instructions) associated with the DC power source 250 is configured to trigger the switching of the switches 232, 234, 236, and 238 according to pulse parameter values. As discussed further herein, the power control component 230 need not operate in a bipolar manner, and in many modes of operation, the power control component provides unipolar pulses.

In some implementations, the electrodes 242 and 244 are separated by a space 220 that defines a volume 222 (shown in FIG. 2) that is defined such that a current discharge density in volume 222 is significantly smaller than that in the plasma formation region 270 during operation of the plasma sputtering chamber 240. The size and/or shape of the volume 222 is defined, in some embodiments, to have a specified current discharge density.

The current discharge density in a volume such as volume 222 corresponds with ignition of a plasma within that volume. For example, a low current discharge density in the volume 222 corresponds with a low probability for ignition of a plasma within volume 222. In other words, the volume 222 can be defined such that the probability for ignition of high density plasma in the volume 222 is substantially lower than that in the plasma formation region 270. In some variations, the volume 222 is defined to satisfy a plasma formation criteria (e.g., threshold, condition) associated with the plasma formation region 270 and/or the volume 222. As discussed, an advantage of anodeless operation is the flexibility to alter the space 220 between the electrodes to effectuate desired sputtering characteristics.

The flow of current between the electrodes 242 and 244, and consequently plasma ignition, is modified using, for example, magnets (not shown) within the plasma chamber 240. For example, in some embodiments, the flow of current between the electrodes 242 and 244 is modified using one or more magnets or an electrically derived magnetic field to cause the current discharge, and thus the probability for plasma ignition, to be much higher in the plasma formation region 270 than in the volume 222.

In some embodiments, the size of the volume 222, process gas pressure, voltage applied to the electrodes, and/or direction of the magnetic field are defined to produce a specified ratio of current discharge density between the plasma formation region 270 and the volume 222. In some implementations, the spacing 220 is significantly smaller than a cathode dark space.

In some variations, the size of the spacing 220 is defined based on a target deposition profile (also referred to as a deposition profile target) associated with the deposition of material from the electrodes 242 and 244 on substrate 260 in the deposition layer 262. In other words, the electrodes 242 and 244 are positioned to achieve the target deposition profile and consequently define, at least in part, the spacing 220, and hence, the volume 222. In some embodiments, the target deposition profile is defined according to one or more deposition profile criteria (e.g., threshold, condition) associated with different locations (e.g., different spatial locations, different areas) associated with the deposition layer 262.

In some variations, for example, the space 220 and/or volume 222 are defined so that material deposited on the substrate 260 from the electrodes 242 and 244 in the deposition layer 262 will satisfy a set of deposition profile criteria (e.g., deposition uniformity criteria) associated with a thin-film transistor process. In some implementations, the target deposition profile includes a target chemical composition and/or a target thickness (e.g., substantially uniform thickness across the substrate 260).

The space 220 and/or volume 222 in many embodiments are defined to account for anisotropic sputtering from the electrodes 242 and 244. For example, the spacing 220 and volume 222 can be defined to reduce the effects of anisotropic sputtering to achieve a target deposition profile of the deposition layer 262 on the substrate 260.

In several embodiments, the spacing 220 (e.g., volume 222) and a distance 210 between the electrodes 242 and/or 244 and the substrate 260 are defined to achieve a particular target deposition profile on substrate 260. Decreasing the distance 210 between the electrodes 242 and/or 244 and the substrate 260, in many embodiments, increases the quality of the deposition layer 262 and/or increases the deposition rate of material from the electrodes 242 and/or 244. For example, in some embodiments, the space 220 (and volume 222) is decreased as the distance 210 is decreased to increase the uniformity of deposition on the substrate 260. In some embodiments, the space 220 (and volume 222) is increased as the distance 210 is decreased to increase the thickness uniformity of the deposition layer 262 on the substrate 260. In addition, process gas pressure cal also be adjusted to achieve desired uniformity and film properties.

Moreover, in some implementations the spacing 220 between the electrodes 242 and 244 is defined based on a pressure threshold condition. For example, in some embodiments, the electrodes 242 and 244 are positioned such that the probability of forming a plasma in volume 220 is minimized, based on the range of expected process gas species and pressures. Initiation of a plasma is dependent on the gas pressure and spacing of the electrodes and as such this may be optimized to reduce the probability of plasma formation.

In addition to the benefit of having more flexible electrode spacing as compared to prior art DC processing techniques, because the DC power pulses in many embodiments are delivered at an ultra-low frequency, the probability of heating of the substrate 260 is lower than that in an analogous AC powered system where, for example, stochastic heating of the substrate 260 can be a prevalent issue. Consequently, the distance 210 between the electrodes 242 and/or 244 and the substrate 260, in some embodiments, is smaller than that in an analogous AC powered system. By decreasing the distance 210, as compared with analogous AC power systems, the deposition profile of the deposition layer 262 can be more readily controlled and film properties can be improved.

And in some embodiments applying alternating DC power pulses, the pulses are delivered at an ultra-low frequency and the electrodes 242 and 244 are inherently both anodes and cathodes; thus, the necessity for anode cooling and plasma sputtering chamber 240 cooling is substantially reduced or eliminated in some embodiments.

In addition to spacing the electrodes 242, 244 to affect a deposition profile, the spacing 220, in some embodiments, is defined such that a probability for arcing or shorting between the electrodes 242 and 244 is substantially close to zero or maintained at an acceptably low level (e.g., below a maximum level) according to, for example, an arcing level criteria (e.g., threshold, condition). If arcing or shorting between the electrodes 242 and 244 occurs, formation of a plasma in the plasma formation region 270 can be detrimentally affected, but in some applications, a low level of arcing between the electrodes 242 and 244 can be tolerated.

In some embodiments, the space 220 and/or volume 222 between the electrodes 242 and 244 is defined so that arcing (e.g., number of arcs, arc current) can be maintained at a specified level without substantially affecting a target deposition profile of a deposition layer 262 on the substrate 260. For example, in some embodiments, the volume 222 is defined so that arcing will be below a specified level and one or more target deposition criteria will be satisfied.

Although decreasing the spacing 220 (e.g., volume 222) between the electrodes 242 and 244, in many embodiments, promotes increased uniformity across the deposition layer 262 (e.g., uniform thickness across the deposition layer 262) and decreases the probability for formation of unwanted plasma between the electrodes 242 and 244, the probability for undesirable arcing between the electrodes 242 and 244 is increased. As a consequence, the spacing 220 between the electrodes 242 and 244 is defined to satisfy (e.g., balance) one or more deposition profile criteria, one or more arcing level criteria, and/or one or more plasma formation criteria.

Figure 3:
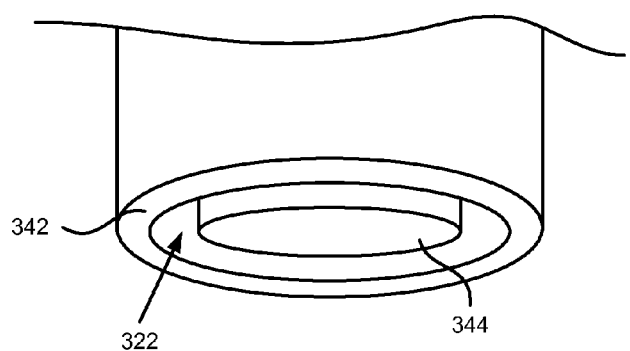
FIG. 3 is a schematic diagram that illustrates a set of concentric electrodes separated by a volume, according to an embodiment of the invention.

Although volume 222 is shown in FIG. 2 as a rectangular volume, this is certainly not required, and in variations, the volume 222 is another of many potential different shapes (e.g., a multi-sided polygon with a specified thickness). For example, FIG. 3 is a schematic diagram that illustrates a set of concentric electrodes 344 and 342 separated by a volume 322, according to an embodiment of the invention. In this embodiment, electrode 342 is an annular electrode. Like the electrodes 242 and 244 shown in FIG. 2, by alternating current to the electrodes 342 and 344, one of the electrodes functions as a cathode for a period of time while the other functions as an anode during that period of time.

FIG. 4 is a graph that illustrates an example of DC voltage applied by a DC power supply (e.g., DC supply 170) to an electrode of a plasma sputtering chamber, according to an embodiment of the invention. The DC voltage shown in FIG. 4 can be, for example, applied to either of the electrodes 242 or 244 shown in FIG. 2, or either of the electrodes 342 or 344 shown in FIG. 3. The graph illustrates voltage on the y-axis with a scale from +z to -z and the x-axis illustrates time increasing to the right.

As shown, the positive DC pulses 410 have a pulse width 482 (e.g., pulse duration) and the negative DC pulses 420 have a pulse width 484. The positive pulses 410 have a pulse height 486 of +z and the negative pulses 420 have a pulse height 488 of -z. In some embodiments, the positive pulses 410 and the negative pulses 420 have the same or different voltage levels. The duty cycle of the positive pulses 410 is defined as the duration of a positive pulse 482 divided by the duration of a cycle 478 (e.g., pulse width of a positive pulse plus the pulse width of a negative pulse). And the duty cycle of the negative DC pulses 420 is defined as the duration of a negative pulse 484 divided by the duration of a cycle 478.

In many embodiments, each of the pulse widths 482 of the positive pulses 410 and the pulse widths 484 of the negative pulses 420 are defined to have a duration longer than a response time of a control loop (e.g., proportional-integral-derivative (PID) control loop, open loop control loop) associated with the DC power supply (e.g., DC power supply 170) to allow for time to accurately produce the DC power pulses 410 and 420.

Although not required, in some embodiments, each of the pulse widths 482 of the positive DC pulses 410 and the pulse widths 484 of the negative DC power pulses 420 are defined to have a duration that is longer than the arc detection time of a DC power supply and/or a duration that is shorter than a thermal time constant associated with an electrode (e.g., edge electrode near the edge of a substrate) to substantially prevent changes in temperature of the electrode that could affect deposition (e.g., uniformity of the deposition, deposition rate).

As shown in FIG. 4, the polarity changes substantially instantaneously from the positive DC pulses 410 to the negative DC pulses 420. In some embodiments, a change or transition from a positive DC pulse 410 to a negative DC pulse 420, and vice versa, is referred to as a transition time period 430. The power changes substantially instantaneously from a positive DC pulse 410 to a negative DC pulse 420, and vice versa, when the transition time period 430 is substantially equal to zero (as shown in FIG. 4).

To achieve a substantially instantaneous change between, for example, a negative DC pulse 420 and a positive DC pulse 410, one or more switches within a DC power supply such as that shown in FIG. 1 are triggered in advance of the change to account for switching time delay. In some embodiments, for example, a switching component such as an FET or IGBT transistor within a DC power supply can have a switching time delay of 10 to a few hundred nanoseconds (ns) (e.g., require 10 to a few hundred ns to change from an on-state to an off-state). Accordingly, the FET or IGBT transistor can be triggered to switch in advance of a specified switching time from a negative DC pulse 420 to a positive DC pulse 410, and vice versa, to account for the switching time delay.

As shown in FIG. 4, a switch is triggered at time T1 based on a switching time delay so that the transition from the negative DC pulse 420 to the positive DC pulse 410 can instantaneously occur at time T2. In some embodiments, the voltage drop when switching between alternating polarities is less than the arc voltage detection capability of the DC power supply to substantially prevent false triggering of arc extinguishing mechanisms associated with the DC power supply.

It should be recognized that the magnitude of the pulses may vary depending upon the particular application. In the context of applying power as part of an ion source for example, the voltages may be 3000 Volts. By way of further example, in the context of bipolar pulses, the voltage may be between +/−3000 Volts. And in unipolar applications discussed further herein, the voltage may range between 0 and a positive 3000 Volts or 0 and a negative 3000 Volts. It should also be recognized that the depiction of negative or positive voltages herein is merely exemplary and that voltages that are depicted as negative may also be generated as positive voltages, and voltages that are depicted as positive voltages may be generated as negative voltages.

In some embodiments of the invention, the transition time period is substantially greater than zero. For example, FIG. 5 is a graph that illustrates a duty cycle that includes a transition time period that is greater than zero, according to an embodiment of the invention. In this embodiment, the transition time period includes a time period 590 where no power is being delivered to a plasma sputtering chamber. The time period 590 may be referred to as an off-time period, and in some embodiments, the off-time period 590 is shorter than an arc detection time period so that the off-time period 590 is not erroneously registered by a DC power supply as an undesirable arc. Otherwise communication between the power control component 110 and/or the DC power source 100 could eliminate false detection of arcing.

Referring back to FIG. 4, the transition time period 430 in many embodiments may be defined so that re-ignition of a plasma within a plasma sputtering chamber is prevented and voltage transients are minimized. Specifically, the transition time period between alternating pulses produced by a DC power source (e.g., DC power source 100) and power control component (e.g., power control component 110) may be defined so that the transition time period is shorter than a plasma decay time period, and as a consequence, the plasma does not need to be re-ignited between alternating DC power pulses. This is in contrast to a plasma sputtering chamber powered by an AC power source where a plasma in a sputtering chamber is re-ignited or is substantially decayed or there are substantial voltage transients with every polarity reversal in the AC cycle (especially when the frequency is relatively low). Moreover, some AC power systems require relatively high ignition voltages, or voltage transients, with each AC half cycle because the plasma can be extinguished completely, and these high ignition voltages, or voltage transients, may be avoided in many embodiments that operate to reduce transition time periods as discussed above.

Even with a duty cycle that has a transition time period greater than zero such as that shown in FIG. 5, the transition time period may be defined such that the plasma is not substantially decayed and/or extinguished during the transition time period. In some embodiments for example, the transition time period is defined to be longer than the decay time associated with a plasma so the plasma is extinguished between alternating polarity pulses of power.

In some embodiments, the pulse widths 482 and 484, transition time period 430, pulse heights 486 and 488, and/or duty cycles, etc. are defined by pulse parameter values that are stored in a memory and/or accessed by a processor associated with the DC power supply or a component of a DC power supply (e.g., power control component 110 and/or DC power source 100). And these pulse parameter values may define the positive DC power pulses 410 and/or the negative DC power pulses 420.

The DC power supply 170, in some variations, is configured to reverse the polarity of a pulse to extinguish an arc in response to detecting the arc. In some embodiments, the DC power supply 170 is configured to deliver more than one positive DC pulse subsequent to another positive DC pulse or deliver more than one negative DC pulse subsequent to another negative DC pulse when delivering alternating power pulses.

FIG. 6 is a table 610 that illustrates an example of pulse parameters 620 and pulse parameter values 630, according to an embodiment of the invention. The table 610 includes, but is not limited to, pulse parameters 620 of pulse power, off-time, pulse duration (width), pulse voltage, cycle time, and polarity. The pulse parameter values 630 are exemplary values only, and in some embodiments, the pulse parameter values 630 vary widely from the pulse parameter values 630 shown in table 610.

Figure 7:
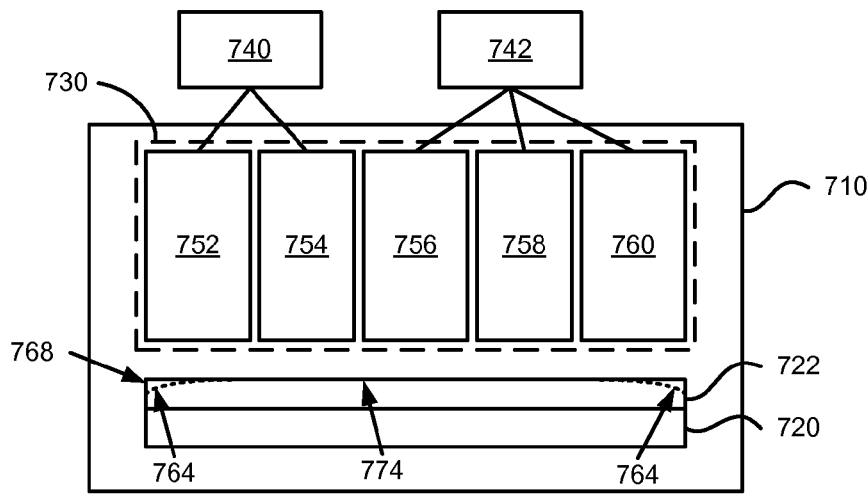
FIG. 7 is a schematic diagram that illustrates a plasma sputtering chamber coupled to DC power supplies, according to an embodiment of the invention.

Referring next to FIG. 7, shown is a schematic diagram that illustrates a plasma sputtering chamber 710 coupled to DC power supplies 740 and 742, according to an embodiment of the invention. The DC power supplies 740 and 742 are configured to deliver DC power pulses to the plasma sputtering chamber 710 to ignite and/or sustain a plasma used to cause deposition of a deposition layer 722 (e.g., a thin-film transistor layer) on a substrate 720. In particular, DC power supply 740 is configured to deliver bipolar and/or unipolar DC pulses to electrodes 752 and 754 and DC power supply 742 is configured to deliver bipolar and/or unipolar DC power pulses to electrodes 756, 758, and 760. Although the DC power supplies 740, 742 are depicted as unitary devices, it should be recognized that the power supplies 740, 742 may be realized by a collection of distributed components. For example, each power supply 740, 742 may include more than one DC power source, and power control component(s) (e.g., switching power control components) may be housed separately from the DC power source(s).

Although certainly not required, in several embodiments, chamber 710 is configured to enable the substrate 720 to remain static during deposition of layer 722, and pulses are applied to the electrodes 730 to effectuate deposition of a deposition layer 722 in accordance with a target deposition profile 768 (e.g., a desired morphology (e.g., topology), thickness, resistance, optical property, film stress, density, crystallinity and/or adhesion, etc.) on the stationary substrate 720.

In many embodiments for example, power to one or more of the electrodes 730 is modulated to enable differential sputtering between the electrodes. In this way, the target deposition profile 768 may be achieved without moving the substrate 720 to accomplish a desired deposition profile. As a consequence, unlike prior art techniques that rely on motion of the substrate 720 to deposit the layer 722 with a desired profile 768, several embodiments of the present invention enable static-substrate deposition, which reduces the likelihood of undesirable particles being generated by the conveyer mechanism and undesirably transported to the surface of a moving substrate; thus reducing the likelihood of arcing and impurities in the layer 722.

For clarity, FIG. 7 does not depict optional feedback line(s) and sensor(s), but in many embodiments, one or more characteristics (e.g., morphology, thickness, resistance, optical property, film stress, density, and/or adhesion, etc.) of the layer 722 are monitored and information indicative of the characteristic(s) is fed back to one or both of the DC supplies 740, 742 and used to modulate power to one or more of the electrodes 730 so that material is deposited on the substrate 720 in accordance with the target deposition profile 768.

In the exemplary embodiment depicted in FIG. 7, both DC power supplies 740, 742 are configured to apply bipolar and/or unipolar DC voltages defined to cause the material from the electrodes 740 and 742 to be deposited in a deposition layer 722 with the specified target deposition profile 768. Although the target deposition profile 768 depicted in FIG. 7 is a uniform thickness deposition profile, in some embodiments, the target deposition profile 768 is a non-uniform thickness and/or non-uniform composition profile. In other words, in some variations, the thickness and/or composition at different points in a target deposition profile are different.

As shown in FIG. 7, the dashed lines 764 illustrate a typical tapered deposition profile (also referred to as thickness roll-off) that departs from the uniform thickness deposition profile 768 near the edges of the substrate 720 absent the techniques described herein. The edge of a substrate is susceptible to thickness roll-off because the electrode near the edge of a substrate, such as electrode 752 shown in FIG. 7, does not have a neighboring electrode that can contribute to deposition at the edge.

In many variations, the DC pulses that are applied to each of the electrodes 730 are produced according to pulse parameter values (e.g., parameter values defining duty cycle, pulse width, pulse magnitude, etc.) that are defined to effectuate sputtering that produces the deposition profile 768. In many implementations for example, the DC pulses (e.g., negative DC pulses and/or positive DC pulses) that are applied to the electrodes 752 and 754 are coordinated to achieve substantially uniform deposition (e.g., without the tapered deposition profile) at the edge of the substrate 720.

Figure 8A:
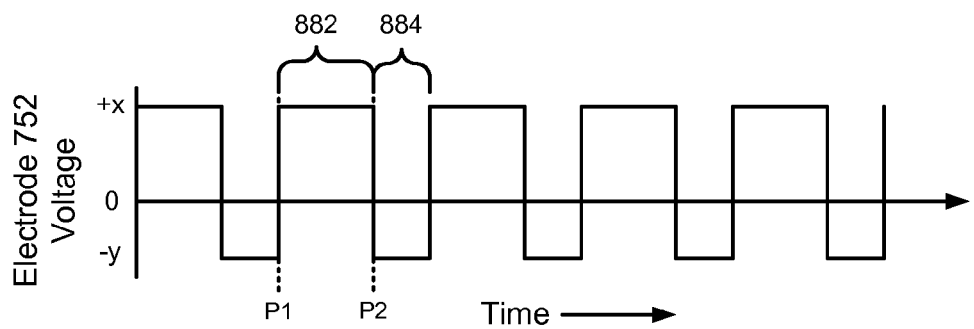
FIG. 8A is a graph that illustrates DC power pulses delivered to an electrode shown in FIG. 7, according to an embodiment of the invention.
Figure 8B:
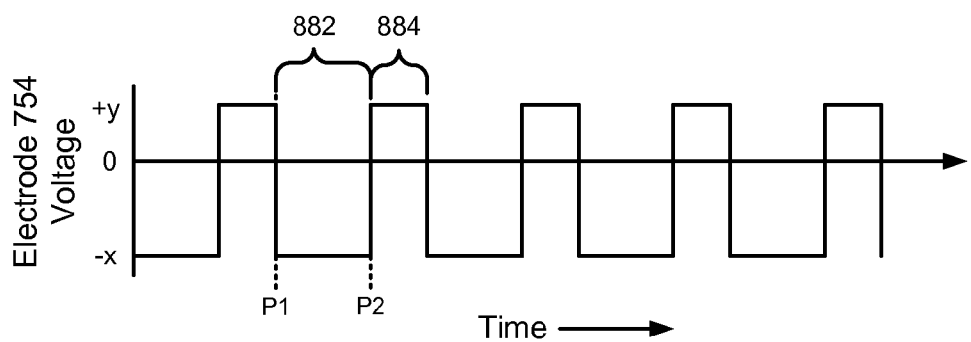
FIG. 8B is a graph that illustrates DC power pulses delivered to an electrode shown in FIG. 7, according to an embodiment of the invention.

For example, the time that electrode 752 is functioning as a cathode may be greater than the time that electrode 754 functions as a cathode. Also, the power level of DC power pulses delivered to electrode 752 while functioning as a cathode may be greater than the power level of DC power pulses delivered to electrode 754 while electrode 754 functions as a cathode. FIGS. 8A and 8B are schematic graphs that illustrate DC pulses delivered to electrodes 752 and 754, respectively, from DC power supply 740 shown in FIG. 7, according to an exemplary embodiment of the invention.

As shown, FIGS. 8A and 8B illustrate DC voltage on their respective vertical axes and time increasing to the right on their respective horizontal axes. The graphs illustrate that when a DC pulse of a specified polarity is delivered to one electrode for a specified period of time, a DC pulse of an opposite polarity is delivered to the other electrode during the same period of time, since a measurement is made with a positive terminal of a probe on the electrode noted on the vertical axis, and the negative terminal on the other electrode of the pair.

For example, starting at time P1 a positive DC pulse at a voltage of +x is delivered to electrode 752 from DC power supply 740 for period of time 882 and a negative DC pulse at a voltage of −x is delivered to electrode 754 for period of time 882. Similarly, starting at time P2 a negative DC pulse at a voltage of −y is delivered to electrode 752 from DC power supply 740 for period of time 884 and a negative DC pulse at a voltage of +y is delivered to electrode 754 for period of time 884.

In this embodiment, the total power delivered by the DC power supply 740 is smaller during time period 884 than during time period 882. By delivering positive DC pulses at higher power levels and for longer periods of time when electrode 752 is functioning as a cathode, the deposition rate near the edge of the substrate 720 (e.g., deposition rate corresponding with electrode 752) will be higher than the deposition rate corresponding with electrode 754.

Referring back to FIG. 7, DC power supply 742, similar to DC power supply 740, in some embodiments configured to deliver DC pulses of longer duration and higher power to electrode 760 than to electrodes 756 and 758 when electrode 760 is functioning as a cathode. In some embodiments, the duration of the DC power pulses delivered to electrode 760 is longer than the duration of the combined DC power pulses of electrodes 756 and 758.

The relative distance, in some variations, of an electrode to the substrate 720 and/or deposition layer 722 is different than another electrode. For example, electrode 752 and electrode 754 can be different distances from the substrate 720 to facilitate deposition of a particular deposition profile such as a uniform target deposition profile. And in some embodiments, the pulses (e.g., duty cycles) applied to an electrode is defined based on the distances of the electrode from the substrate 720 and/or deposition layer 722.

In some embodiments, a size (e.g., width, height), a shape (e.g., annular, rectangular), and/or a composition (e.g., specific chemical composition of metal, metallic compound, or ceramic) of one or more of the electrodes 730 is defined to facilitate deposition of a particular deposition profile. In some embodiments, one or more of the electrodes 730 can be a different size, shape, and/or composition than another of the electrodes 730. In some embodiments, one or more of the pulses (e.g., duty cycles) applied to an electrode are defined based on the size, shape, and/or composition of the electrodes.

In some embodiments, two of the electrodes 730 include different materials (e.g., different target materials), and DC pulses may be defined and applied (e.g., defined using pulse parameter values) to the electrodes 730 constructed of different materials to achieve a deposition layer 722 of a particular chemical composition (e.g., specified stoichiometry). One example is combining Indium and Tin target materials with Oxygen and Argon gas to metallic sputter Indium Tin Oxide. This type of sputtering, in some variations, is referred to as co-sputtering, and this technique is attractive because it can be used to deposit films with controlled mixtures of materials. This can be done to control stoichiometry or because a compound target material is difficult to sputter or expensive and/or difficult to create. As another example, $Al_2O_3$ can be deposited with a refractive index of about 1.66 and $TiO_2$ can be deposited with a refractive index of about 2.4. A reactive co-sputtering process with an Al target and a Ti target and oxygen as the reactive gas is capable in principle of depositing films with a refractive index between 1.66 and 2.4.

In many embodiments electrodes 730 in the embodiment depicted in FIG. 7 are powered by two different DC power supplies 740, 742 that apply DC pulses at ultra-low frequencies, and as a consequence, the DC power supplies 740, 742, in some implementations, are load matched. In other words, the DC pulses generated by the DC power supplies 740, 742 can be coordinated to, for example, reduce plasma arcing, increase deposition control according to a target deposition profile, and reduce thermal inconsistency within the plasma sputtering chamber 710.

By way of further example, in some variations, DC power supplies 740, 742 are configured to deliver DC pulses such that electrodes 754 and 756 are not functioning as cathodes at the same time to avoid simultaneously depositing material from both of the electrodes 754 and 756 at location 774. In some variations, DC power supplies 740 and 742 are configured to deliver DC power pulses such that electrodes 754 and 756 are functioning as cathodes or as anodes at the same time.

Although in this embodiment the electrodes 730 receive pulses from two different DC power supplies 740, 742, in some embodiments, the electrodes received power pulses from a single DC power supply that includes, for example, a multi-phase bridge in a power control component that controls and/or defines the distribution of power in DC pulses. This type of arrangement can be referred to as a multiple magnetron arrangement, and in some implementations, the electrodes 730 receive DC power pulses from more than two DC power supplies (e.g., one DC power supply for each electrode). And in other embodiments DC pulses are defined/coordinated between non-adjacent electrodes.

Figure 9:
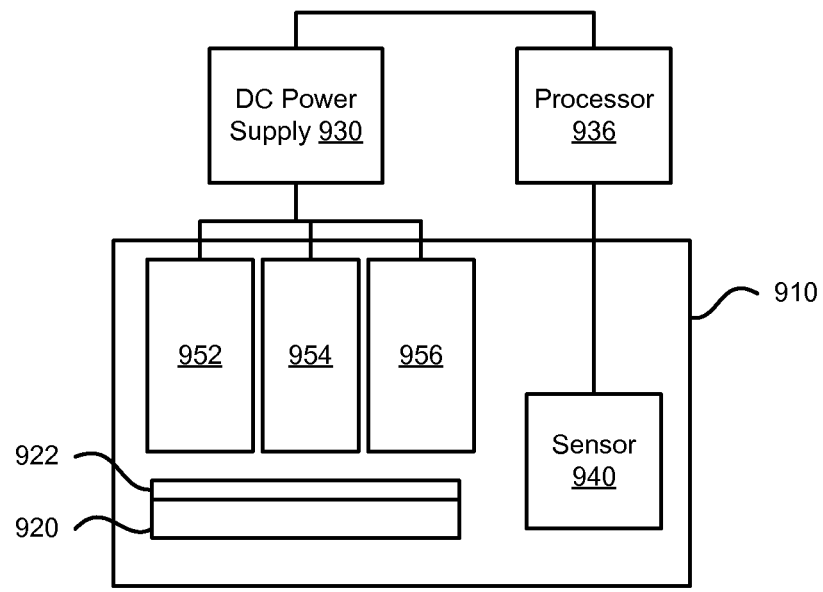
FIG. 9 is a block diagram that illustrates a plasma sputtering chamber configured
to receive DC power pulses delivered by DC power supply, according to an embodiment of the invention.

FIG. 9 is a schematic block diagram that illustrates a plasma sputtering chamber 910 configured to receive DC pulses applied by DC power supply 930, according to an embodiment of the invention. The DC power supply 930 is configured to modify DC power pulses delivered to the plasma sputtering chamber 910 based on at least one process feedback signal (e.g., signal associated with a sensor measurement value such as a voltage signal or current signal) produced by a sensor 940.

A processor 936 is configured to receive the feedback signal from the sensor 940 and trigger modification of one or more DC pulses applied by DC power supply 930 to the plasma sputtering chamber 910 based on the feedback signal. The plasma sputtering chamber 910 is used to sputter a deposition layer 922 on a substrate 920 disposed within the plasma sputtering chamber 910. In some embodiments, the deposition layer 922 is associated with a thin-film transistor process. Although the sensor 940 is depicted within the chamber 910, this is certainly not required, and one of ordinary skill will appreciate that the sensor 940 in some instances may be located outside of the chamber.

In some embodiments, the processor 936 is configured to query the sensor 940 for a feedback signal. In some embodiments, the sensor 940 is configured to send a feedback signal to the processor 936 when a change in, for example, a sensor measurement value (e.g., voltage signal) associated with the sensor 940 is detected. In some embodiments, the processor 936 is configured to periodically or randomly receive a feedback signal from the sensor 940 and trigger one or more changes in DC power pulses delivered by the DC power supply 930 when a change (e.g., change that exceeds a threshold condition) in a monitored parameter occurs.

In some embodiments, the sensor 940 is a thickness monitoring device (e.g., electrical and/or optical measuring device) configured to monitor the thickness of the deposition layer 922 and send information indicative of the thickness to the processor 936. In some embodiments, the sensor 940 is configured to monitor a portion (e.g., specified area, specific location) of the thickness of the deposition layer 922, and based on the information from the sensor, the processor 936 is configured to modulate the power that the DC power supply 930 applies to one or more of the electrodes 952, 954, 956. In some implementations, the processor 936 is configured to modify one or more pulse parameter values used to define one or more of the DC pulses. In some implementations, the sensor 940 is a pressure sensor, a deposition rate sensor, conductivity sensor or a temperature sensor.

In some embodiments, multiple sensors (not shown) are configured to send feedback signals to the processor 936, and the processor 936 is configured to change the DC pulses based on the combination of the feedback signals. In some implementations, one or more of the feedback signals are associated with different spatial locations of the deposition layer 922 and the processor 936 is configured to modify DC pulses corresponding with each of the spatial locations if necessary.

In some implementations, the processor 936 is configured to change (e.g., modify) or trigger a change in a pulse parameter value (e.g., stored in a memory (not shown)) associated with a DC pulse to cause a change in a DC pulse based on one or more feedback signals (e.g., deposition rate feedback signal, temperature feedback signal, pressure feedback signal). For example, the processor 936 may be configured to select one or more sets of pulse parameter values stored in a memory from a library of pulse parameter values based on one or more feedback signals from one or more sensors. In some alternative embodiments, the processor 936 is configured to calculate characteristics of a DC pulse that should be applied to one or more electrodes (e.g., based upon feedback from the sensor 940) using equations (e.g., an algorithm) stored in a memory. The DC power pulses, in some implementations, are modified by changing and/or managing (e.g., controlling) the current, duty cycle, and/or voltage to one or more of the electrodes 952, 954, 956.

As an example, in some embodiments data related to the DC pulses is collected and used to calculate an average sputter power for one or more of the electrodes 952, 954, 956, and the DC pulses are modified to maintain a specified average sputter power over a specified period of time. The specified average sputter power is, in many embodiments, associated with one or more electrodes, and in some embodiments, an average sputter power threshold or average sputter power condition is defined based on a desired target deposition profile.

Although the processor 936 is shown as a stand-alone component in FIG. 9, in some implementations, the processor 936 (or the functionality of the processor 936) is included as part of the DC power supply 930 or the sensor 940. The processor 936 in some embodiments includes one or more modules that can be hardware and/or or software modules that are executed on the processor 936.

Figure 10:
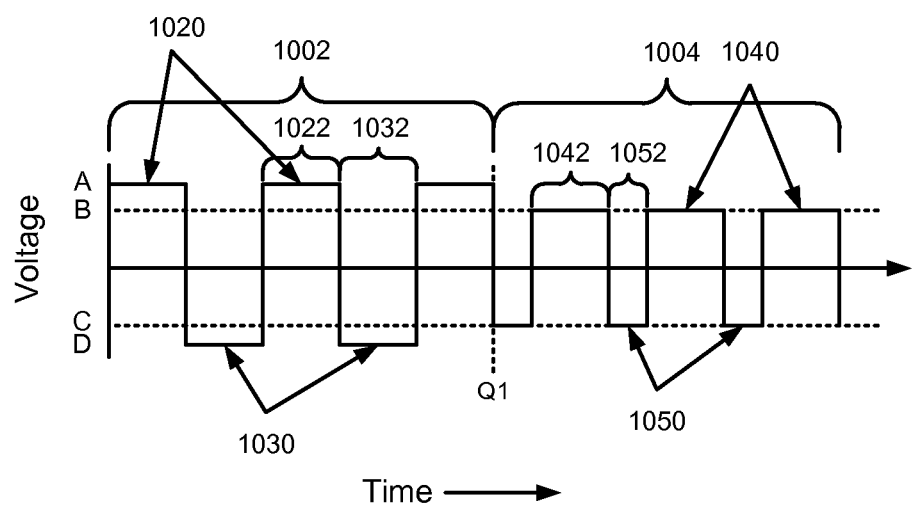
FIG. 10 is a schematic diagram of a graph that illustrates a change in DC power pulses triggered by one or more feedback signal from one or more sensors, according to an embodiment of the invention.

FIG. 10 is a graph that depicts an exemplary change in DC pulses triggered by one or more feedback signals from one or more sensors, according to an embodiment of the invention. It should be recognized that the pulse modulation depicted in FIG. 10 is merely exemplary of the type of pulse modulation (e.g., pulse width and magnitude) that may be carried out to effectuate a desired deposition profile, and that the specific modulation is potentially dependent upon many factors (e.g., the target material, electrode spacing, deposition profile, etc.). In addition, in some embodiments, pulse modulation is carried out to effectuate a particular target utilization (e.g., to optimize target material utilization). As shown, the graph illustrates DC voltage on the y-axis and time increasing to the right on the x-axis.

As shown in FIG. 10, the DC pulses are modified at time Q1 in response to a feedback signal between a first time period 1002 and a second time period 1004. During the first time period 1002, the positive DC pulses 1020 have a pulse height of A and a pulse width of 1022, and the negative DC pulses 1030 have a pulse height of D and a pulse width of 1032. During time period 1004, the positive DC pulses 1040 have a pulse height of B and a pulse width of 1042 and the negative DC pulses 1050 have a pulse height of C and a pulse width of 1052.

As depicted, during the second time period 1004, the pulse width 1042 of the positive DC pulses 1040 is greater than the pulse width 1022 of positive pulses 1020 during the first time period 1002 and the pulse height B of the pulses during the second time period 1004 is less than the pulse height A of the of positive pulses 1020 during the first time period 1002.

Figure 11:
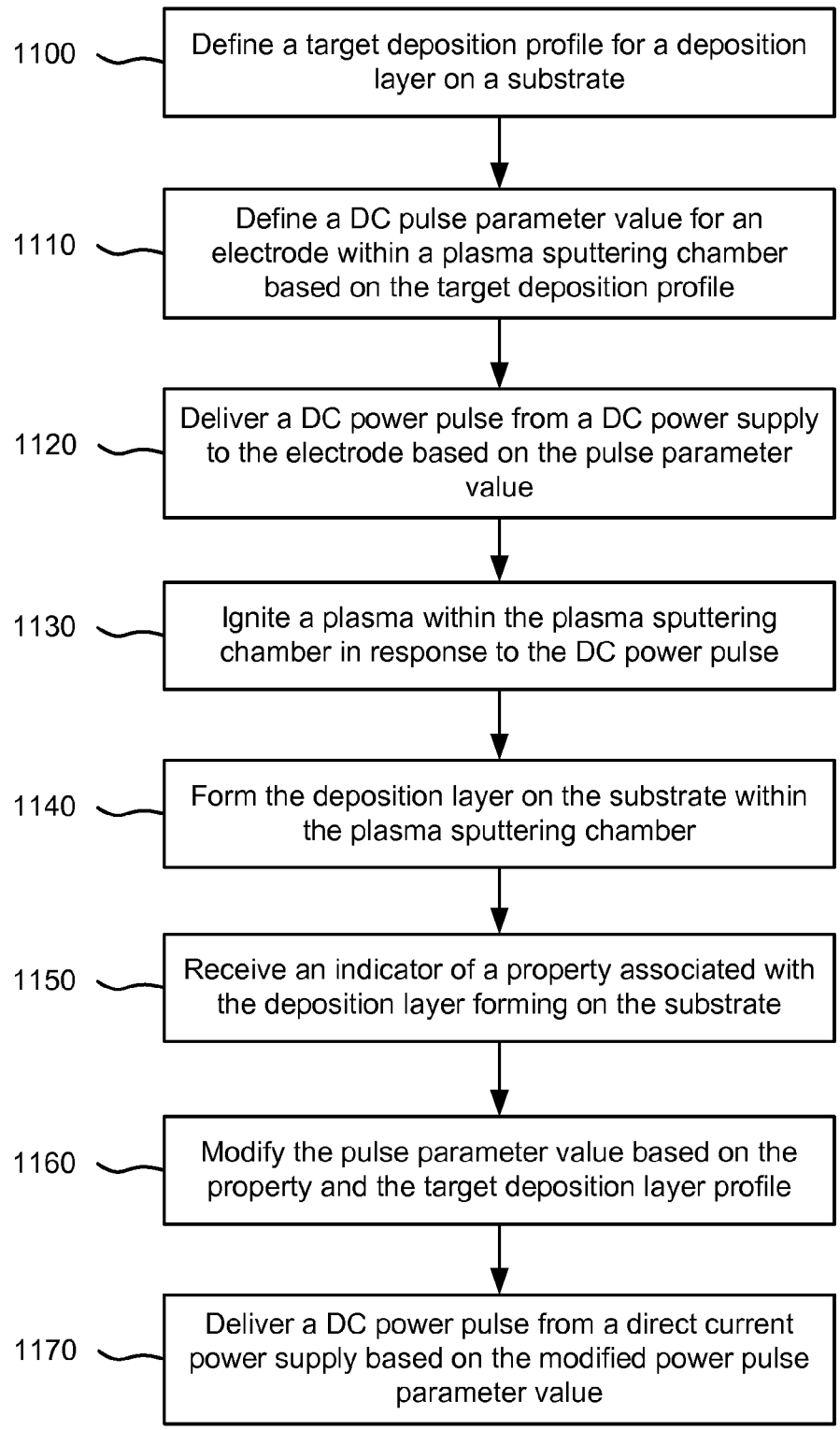
FIG. 11 is a flowchart that illustrates a method for modifying a DC power pulse in response to a property associated with a deposition layer, according to an embodiment of the invention.

Referring next to FIG. 11, shown is a flowchart that illustrates a method for modifying a DC pulse in response to a property (also can be referred to as a characteristic) associated with a deposition layer, according to an embodiment of the invention. As shown, a target deposition profile for a deposition layer on a substrate is initially defined in terms of one or more characteristics (e.g., thickness, resistance, an optical property, film stress, density, and adhesion) (Block 1100). As discussed, the target deposition profile may be a uniform or non-uniform thickness profile with a specified chemical composition, and the target deposition profile may specify varying chemical compositions at different locations in the deposition layer.

As depicted, in some embodiments a pulse parameter value is defined for at least one electrode within a plasma sputtering chamber based on the target deposition profile (Block 1110). The pulse parameter value is defined to cause deposition according to the target deposition profile. As discussed, in some embodiments, pulse parameter values may be calculated during deposition and in other embodiments pulse parameter values may be predefined and accessed from a table.

Once a pulse parameter value is defined, a DC pulse is applied to the electrode based on the pulse parameter value, and a plasma is ignited within the plasma sputtering chamber in response to the DC pulse (Blocks 1120 and 1130).

As shown, once the plasma is ignited, the deposition layer is formed on the substrate within the plasma sputtering chamber (Block 1140). As previously discussed above, in many embodiments, while the deposition layer is formed, the substrate is statically maintained in substantially one position, and in other embodiments, the substrate is moved during deposition.

As depicted in FIG. 11, in many embodiments information indicative of a property (e.g., thickness, resistance, chemical composition, optical characteristic, film stress, density, adhesion, temperature and/or pressure within the chamber) associated with the deposition layer is received during while the deposition layer is being formed (Block 1150).

In response to the feedback from the chamber, in many implementations, the pulse parameter value is modified based on the received information and the desired target deposition profile (Block 1160). For example, if the property is a chemical composition and the information indicates that the chemical composition of the deposition layer is different than that specified target property associated with the target deposition profile, the pulse parameter value may be modified to cause sputtering that will satisfy the target property associated with the target deposition profile. As shown, after the pulse parameter value has been modified (Block 1160), a DC pulse is applied to the electrode based on the modified pulse parameter value (Block 1170).

Figure 12:
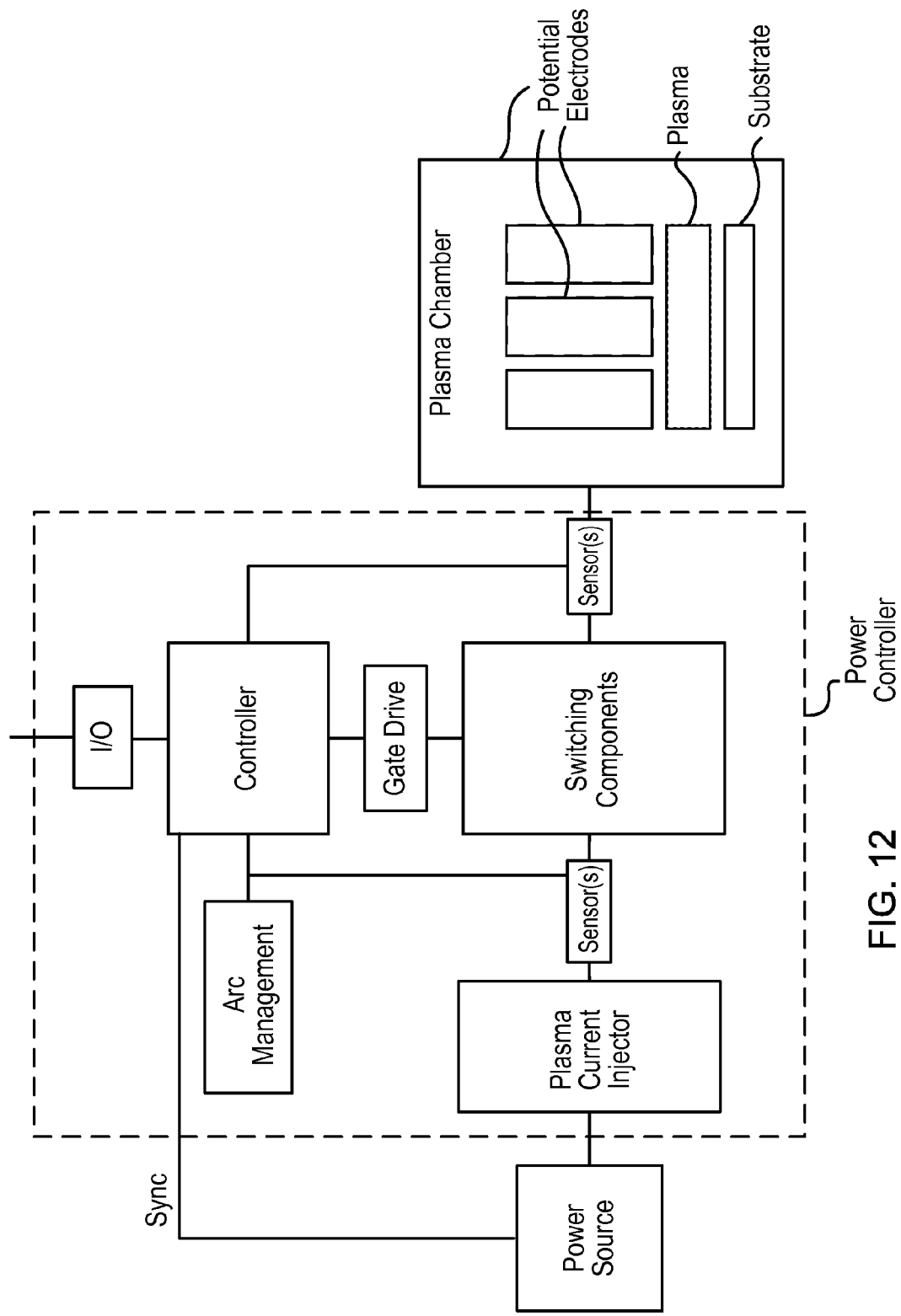
FIG. 12 is a block diagram depicting an exemplary embodiment of a power supply.

Referring next to FIG. 12, shown is a block diagram depicting another embodiment of a power controller. As depicted, a plasma current injector is coupled to switching components (e.g., IGBTs arranged in one or more H-bridge configurations). In addition, the power controller includes a controller that is coupled to an arc management component, a sensor(s), and a gate drive component. It should be recognized that FIG. 12 is intended to logically depict functional components of an exemplary power controller, which in reality, made be realized by the combination of several integrated or distributed components.

Also shown are a power source and a plasma chamber that are coupled to the power controller. The power source in this embodiment may be either a voltage source or a current source, and it is contemplated that the power source may include multiple power supplies that operate at power levels that may be determined by factors such as the processing application, power supply availability, control considerations, etc.

As depicted, the electrodes in the chamber may be realized in a variety of different ways depending upon the desired effects within the chamber. In some implementations, there are multiple electrodes, which may be operated as both anodes and cathodes (e.g., bipolar modes of operation). And in other implementations, one electrode may operate as a cathode while another electrode may function as an anode (e.g., in a unipolar mode of operation). In addition, it is certainly contemplated that the chamber itself may function as an electrode (e.g., an anode).

Figure 13:
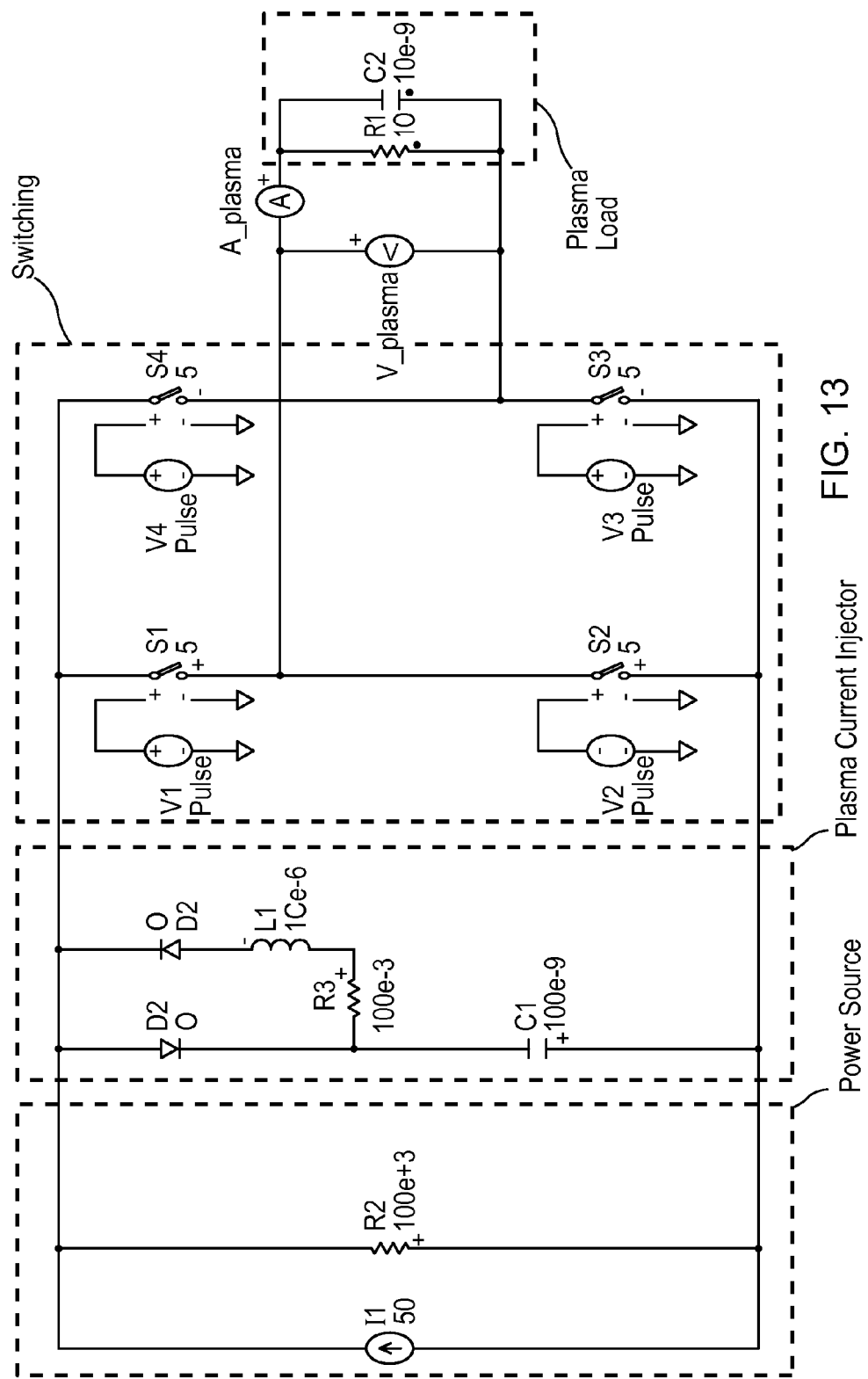
FIG. 13 is an exemplary embodiment of the plasma current injector depicted in FIG. 12.

Referring next to FIG. 13, shown are details of an exemplary embodiment of the plasma current injector depicted in FIG. 12. As depicted, the plasma current injector is coupled to both the switching components (e.g., IGBTs) and the power source (e.g., current or voltage source). For simplicity, details of the power source and switching components are omitted.

Figure 14:
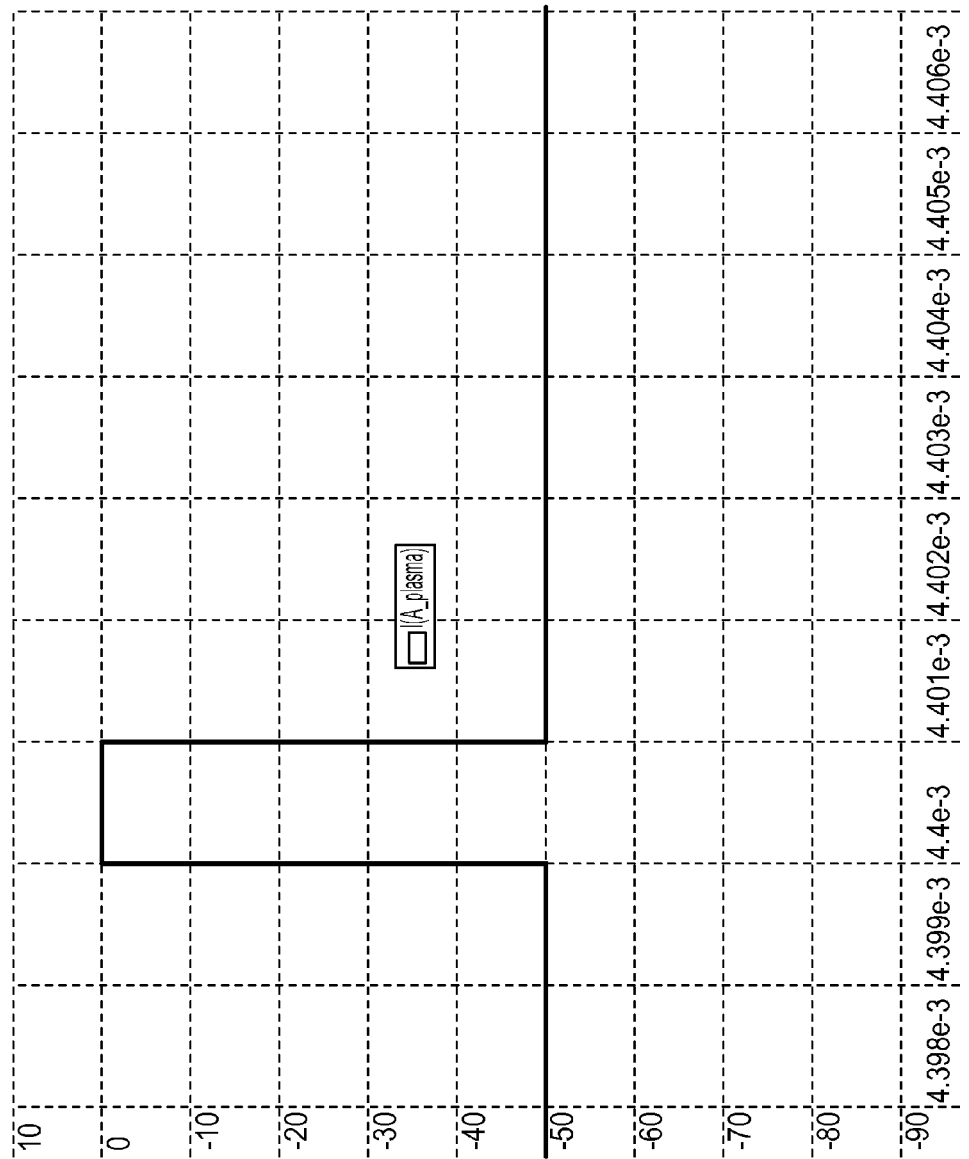
FIG. 14 is a graph depicting current waveform behavior without the plasma current injector of FIGS. 12 and 13.
Figure 15:
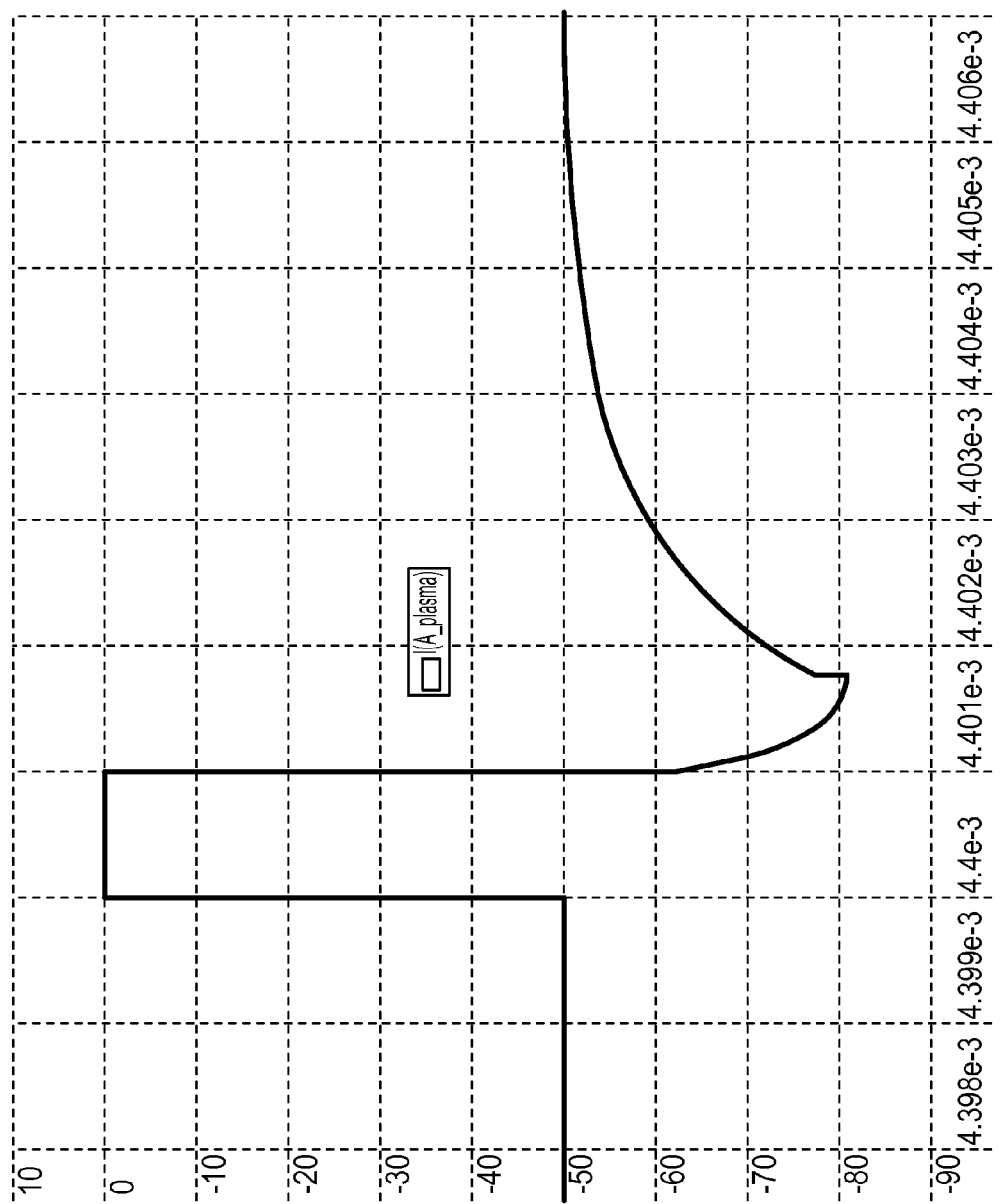
FIG. 15 is a graph depicting current waveform behavior with the plasma current injector of FIGS. 12 and 13.

As depicted, D1, D2, R3 L1 and C1 are part of the plasma current injector, and I1 and R2 represent components of the power source (e.g., the power source of an ASCENT power supply supplied by Advanced Energy Industries, Inc). Components S1 and V1 represent the switching components (e.g., IGBTs arranged in an H-bridge), and R1 and C2 represent a plasma load. While referring to FIG. 13, simultaneous reference is made to FIG. 14, which depicts current waveform behavior without the plasma current injector, and reference is made to FIG. 15 which depicts current waveform behavior with the plasma current injector.

As depicted, effects of the current injector may be seen by noticing that the current is not a value of zero immediately following a voltage transition. In the waveform depicted in FIG. 15, it is estimated that a peak current injector value of approximately 25 A is applied.

Injection of additional current into the plasma immediately after a voltage transition can result in a significant deposition process advantage, and beneficially, the magnitude and duration of current injection may be programmed by adjusting the values of L1 and C1.

Figure 16:
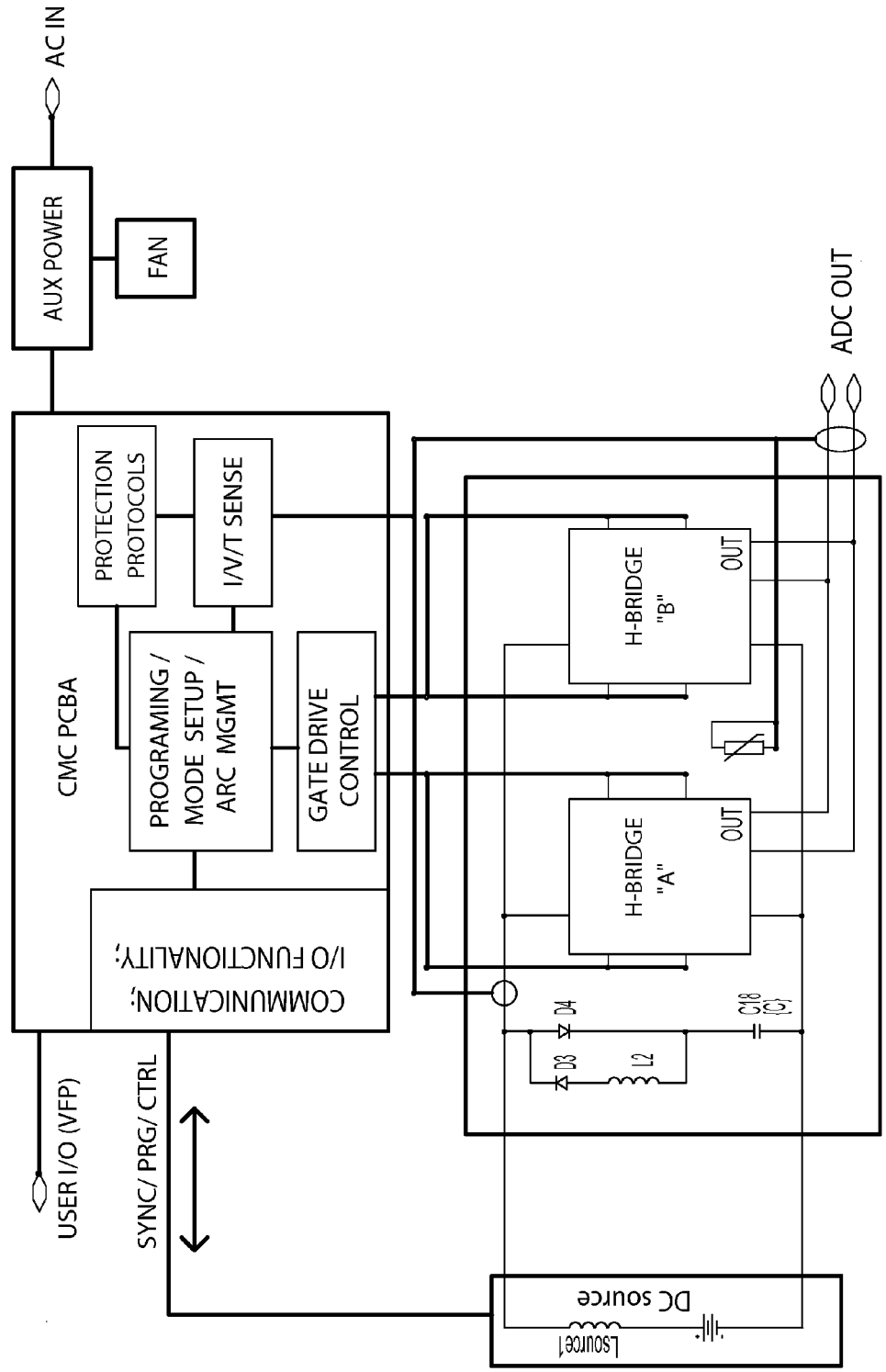
FIG. 16 is a block diagram depicting another embodiment of a power supply including an exemplary power controller that is coupled to a DC source.

Referring next to FIG. 16, shown is yet another embodiment of a power controller that is coupled to a DC source. As depicted in FIG. 16, N switching cells (e.g., H-Bridge cells) may be utilized to provide desired levels of current and/or desired frequencies.

In many implementations, an H-bridge is a basic switching cell of the power controller. The operation of this cell is defined by technology limitations of the switching elements, and in order to increase the overall capabilities of the power controller, the N cells are integrated to interoperate. For example, operating the switching the cells in an interleaved mode allows an increase in switching frequency that is approximated by a multiple of the number of switching cells. (e.g., the N cells allows a maximum frequency to increase to fmax=fmaxsingle×N).

Switching in a parallel mode also increase the total output power of the box by a factor of "M" (having "M" paralleled switching cells) Po-total=M×Po-single.

It is possible to have a combination of the two modes and tailor the operation of the system to address specific frequency and power requirements. For example, having "M×N" cells would allow system to run "M" paralleled cells interleaved "N" times, operating at frequency fmax=fmaxsingle×N and providing output power Po-total=M×Po-single.

Figure 17:
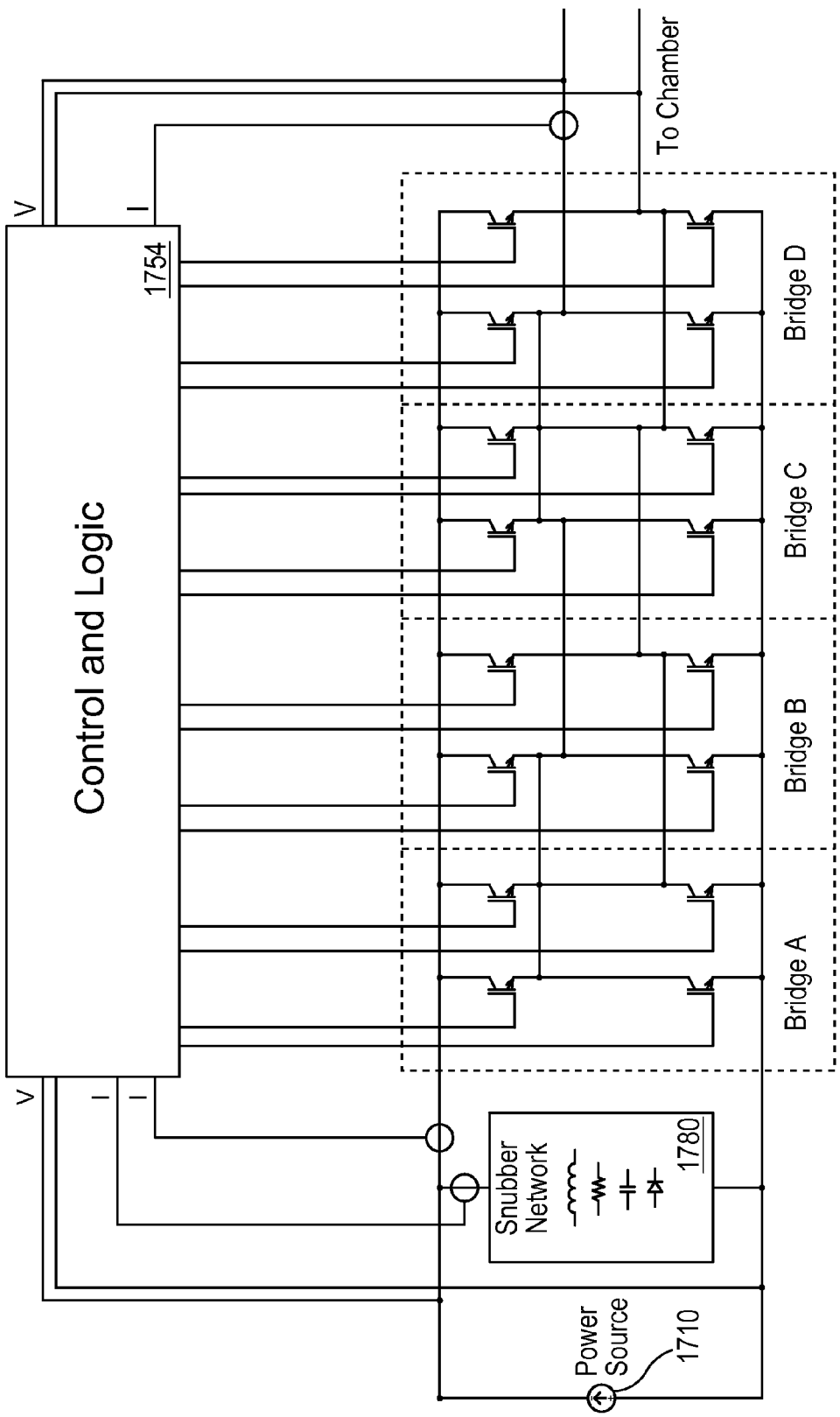
FIG. 17 is a diagram depicting yet another embodiment of a power supply.

Referring next to FIG. 17, shown is an exemplary embodiment of a DC power supply. As shown, in this embodiment a power control portion of the power supply includes four H-bridge switching cells, a snubber network 1780, and a power control component 1754. In general, the power control component 1754 is configured to control H-bridge switching cells to apply DC power pulses with a desired duty cycle and/or frequency to achieve a desired processing effect. As discussed further herein, the frequency of the DC power pulses may be adjusted to effectuate a desired processing effect including a desired film property (e.g., optical characteristic, resistance, and stress) or processing characteristic (e.g., sputtering rate).

In addition, the duty cycle of the applied pulses may be adjusted to control film growth properties. For example, film growth can be modified by the average and peak power density on a cathode. And the off time of the plasma may also affect the growth. As a consequence, the duty cycle variability that is enabled by this architecture can be optimized for desired film growth and properties such as stress, optical transmission, and resistance. In addition, as discussed further herein, the frequency of the applied pulses may also be adjusted to achieve desired processing effects such as film growth properties and arc rates.

As shown, voltage and current are sensed at the output of the DC power supply to enable changes in plasma impedance, which is indicative of various processing effects (e.g., film properties and sputtering rate), to be monitored and utilized as an input to control the frequency and/or duty cycle to arrive at one or more desired processing effects.

Figure 18:
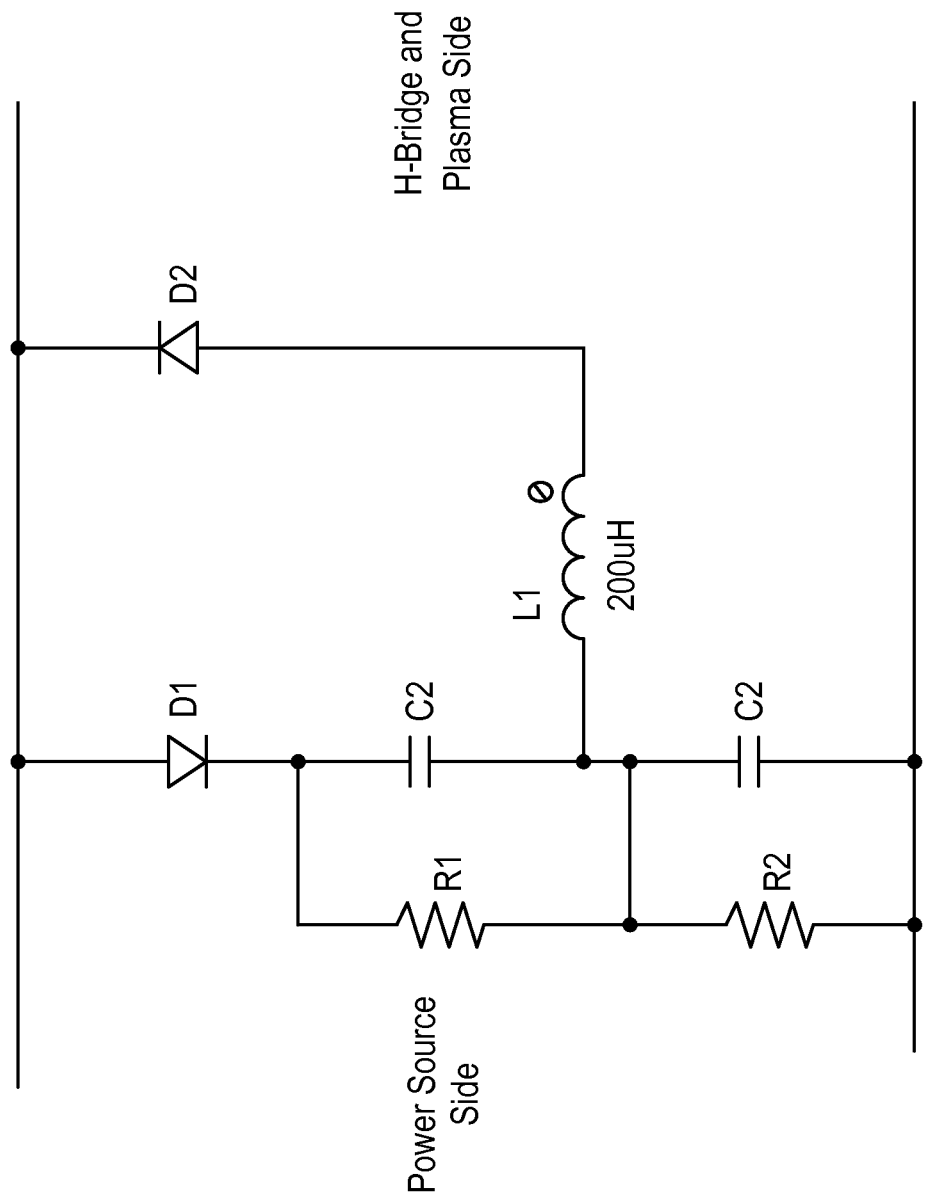
FIG. 18 is an exemplary embodiment of the snubber network depicted in FIG. 17.

Referring next to FIG. 18, shown is an exemplary embodiment of the snubber network 1780 depicted in FIG. 17. The exemplary snubber network is designed to substantially increase an arc rate limit relative to prior snubber designs. As shown, the exemplary snubber includes a voltage divider arrangement of the snubber capacitor, which enables the inductor current ramp down slope to be significantly increased.

In operation, during an arc condition, current ramps up through the inductor L1 as a time dependent function of the voltage across the inductor L1 during this interval. For example, the voltage across the inductor during this interval may be approximately 250 Volts in the case of the capacitance of C1 being equal to the capacitance of C2 and with a plasma process voltage of 600V resulting in each capacitor being charged to 300 Volts (half the process voltage) minus an arc voltage of about 50 Volts.

After an arc condition, current ramps down through the inductor as a time dependent function of the voltage across the inductor during this interval. The voltage across the inductor during this interval is approximately 300 Volts (half of the process voltage and the voltage drop across D1 and D2). It has been found that the maximum sustainable arc rate to avoid current ramp up with the exemplary snubber is approximately 22 kHz.

A beneficial feature of the exemplary snubber is that, in the case of repetitive arcing conditions, the snubber increasingly contributes less energy to the plasma load during each subsequent arc. The primary mechanism contributing to this effect is that the voltage across C2 is decreasing as charge from C2 is transferred into the plasma arc via the inductor.

Figure 19:
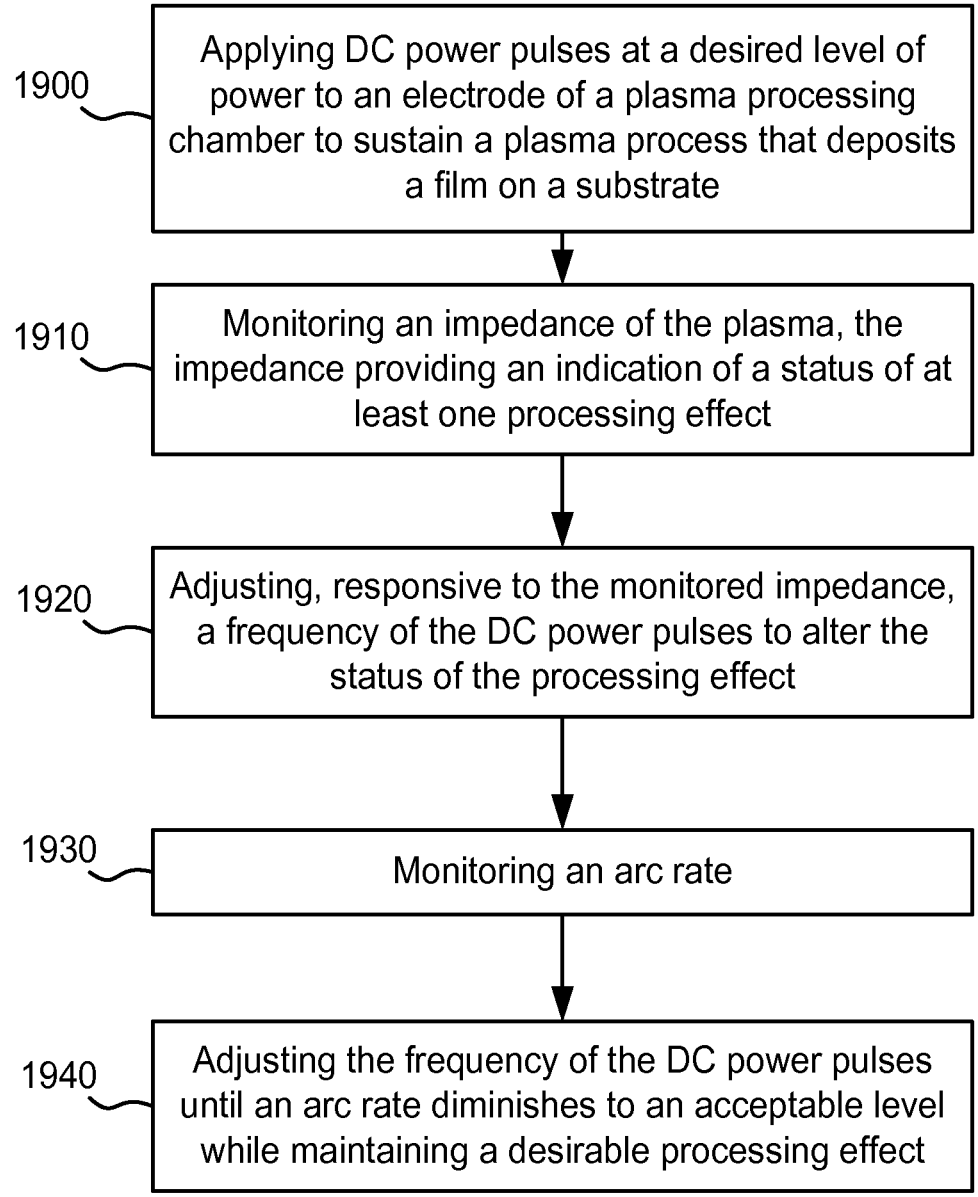
FIG. 19 is a flowchart depicting an exemplary method for controlling processing effects.

Referring to FIG. 19, shown is a flowchart depicting an exemplary method for controlling processing effects (e.g., film properties, arc rate, and sputter rate) by varying an output frequency, which may be carried out in connection with the embodiments disclosed previously herein. As shown in FIG. 19, DC power pulses are applied to at least one electrode of a plasma processing chamber to sustain a plasma process that deposits a film on a substrate (Block 1900). And in this method, an impedance of the plasma is monitored, which provides an indication of a status of at least one processing effect (Block 1910). The processing effects may include one or more film properties (e.g., resistance, stress); deposition rate; and the occurrence of arcs.

With respect to film properties, the impedance can relate to film growth characteristics such as crystallinity or stoichiometry. These relate to the measured performance of the film and include items such as film resistivity, optical properties (reflection, absorption, transmission), and film stress, etc. There is evidence that certain materials, such as ITO, exhibit lower resistance during low temperature deposition if the sputter voltage (impedance) is lower. And in connection with deposition rate, there are two main reasons that impedance can be related to deposition rate. The first is that if the voltage is sufficient for sputtering, then the deposition rate is proportional to electric current. As impedance is lowered the current increases for a given output power.

In addition, arc rates affect plasma impedance. During a reactive process there are significantly higher arc rates when the process is in the oxide or poisoned mode. The arc rates are reduced when operating in metal mode (oxygen or reactive gas deficient). As there is an impedance change between metal and poisoned modes of operation the control (reduction) of arc rate can be achieved by monitoring and maintaining a desired impedance.

As one of ordinary skill in the art will appreciate, the impedance of the plasma may be calculated by having any two values of power, current, and voltage at the output of the power supply.

As shown, responsive to the monitored impedance, a frequency of the DC power pulses is adjusted, if needed, to alter the status of the processing effect (Block 1920). A pulsed plasma (and the frequency thereof) affects film properties due to the removal and/or reversal of power (voltage) to the plasma. During the off time there can be a change in the film growth and structure which can alter many film performance properties. And a reversal in voltage (e.g., during each cycle) may clear charge build up on the target surface and may also drive ions into the substrate that will also affect film growth. Energetic ions that bombard the substrate may remove weakly bonded material, increase packing density, damage the film, etc. The film density and crystal structure, which are affected by the frequency of applied power, may affect performance in stress, resistance, etc.

In some modes of operation, the arc rate is monitored (Block 1930), and the frequency of the applied power is increased until the arc rate diminishes to an acceptable level (Block 1940). For example, a desirable processing effect (e.g., film stress or resistance) may be monitored (e.g., by monitoring plasma impedance), and the frequency of the applied power may be increased to reduce the arc rate without adversely affecting the desirable processing affect.

In addition to monitoring impedance (or instead of monitoring impedance), in some modes of operation, closed loop control may be implemented that utilizes a sensor to detect a processing effect. For example, optical characteristics of a deposited film may be measured using known techniques such as a plasma emission monitor (which detects the color aspect or stoichiometry of the plasma), an oxygen sensor (which electrically detects oxygen content in the chamber by means of a catalytic reaction), or a photospectrometer (which measures the film performance by optically measuring reflection or transmission of the film).

In some exemplary modes of operation, closed loop control may be used to maintain a working point for reactive sputtering. For example, DC pulses may be applied to operate a cathode in a plasma chamber that initially only includes a noble gas such as Argon. And then a percentage of gaseous diatomic oxygen in the processing chamber is increased in small increments (e.g., one percent in each increment). At each of these incremental steps, the process voltage may be documented and one or more processing effects (e.g., deposition rate, optical characteristic, stress, resistance, etc.) may be measured.

From this data, a "working point" may be defined based upon one or more desired processing effects. For example, the working point may be a point where the deposition rate and the status of a particular film property are desirable, and at this working point, both the percentage of diatomic oxygen in the chamber and the process voltage may be captured and stored. And then the frequency of the applied power may be increased or decreased in order to increase or decrease the working voltage to maintain a stable process.

Figure 20:
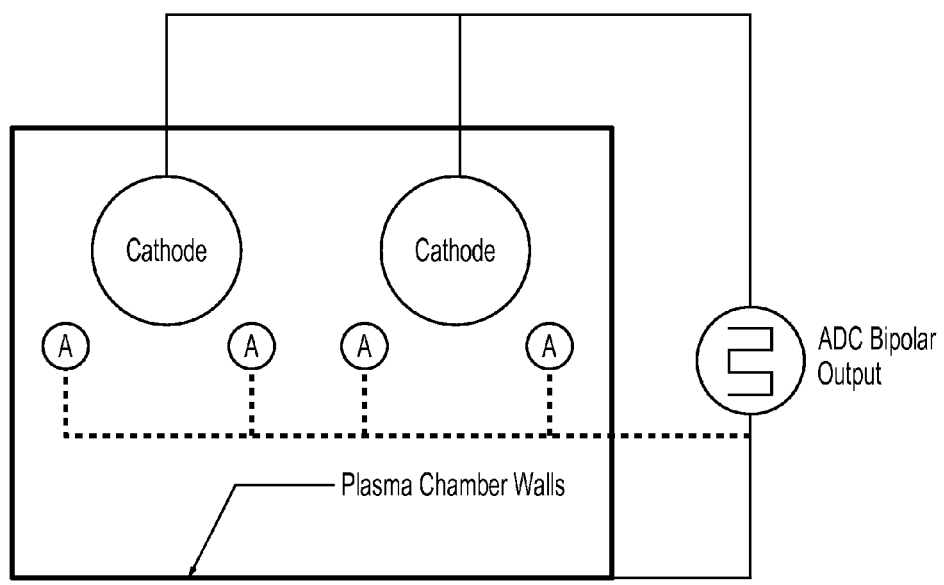
FIG. 20 is a representation of a plasma chamber arranged and configured to effectuate a unipolar mode of operation.
Figure 21:
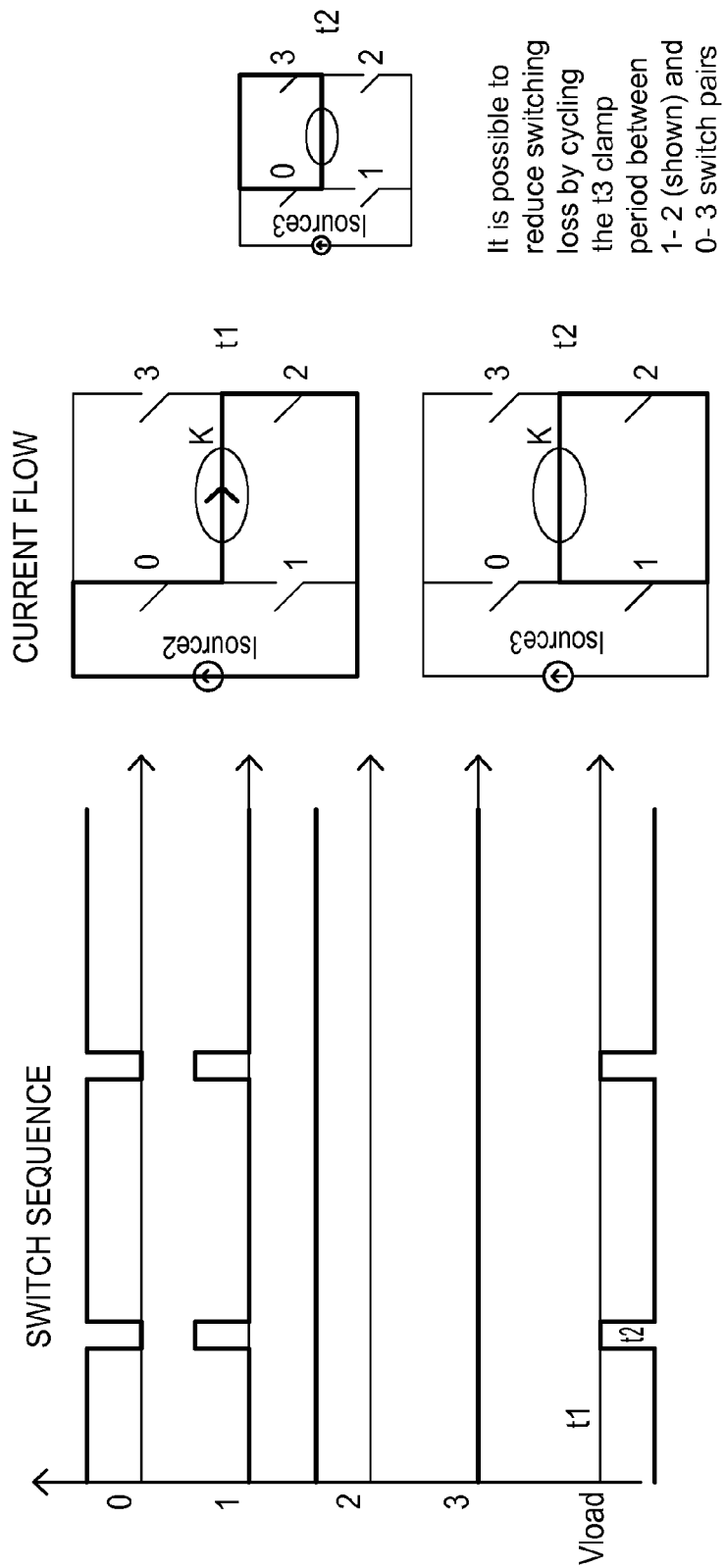
FIG. 21 is a diagram depicting an exemplary switch sequence that may be carried out in connection with the plasma chamber of FIG. 20.

Referring next to FIGS. 20 and 21, shown are a schematic representation of a plasma chamber arranged and configured to effectuate a unipolar mode of operation and a diagram depicting an associated switch sequence, respectively. As depicted, there are both dedicated cathodes (e.g., which do not function as anodes) and dedicated anodes (e.g., the chamber or internal electrode, which do not function as cathodes). And as depicted in FIG. 21, the voltage applied to the load in this mode of operation does not alternate in polarity. Instead, it approaches and/or reaches zero before the voltage is pulled to a more negative value.

Figure 22:
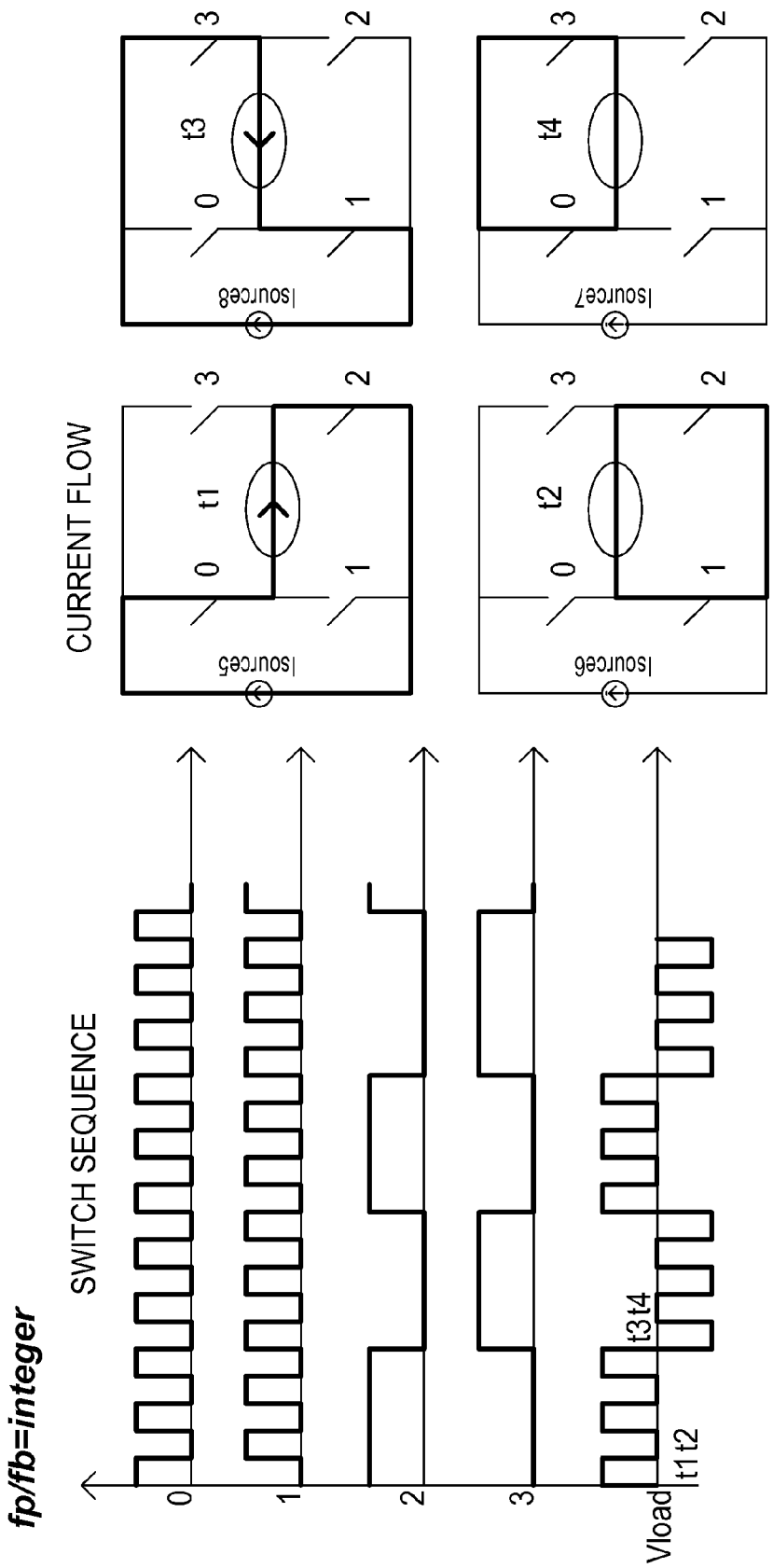
FIG. 22 is an exemplary switching sequence associated with a bipolar mode of operation.

Referring next to FIG. 22, shown is a switching sequence associated with a bipolar mode of operation in which two or more electrodes operate as both cathodes and anodes (so there is no need for dedicated anodes). In this mode of operation, an integer number of pulses is applied per each half period is carried out.

In this mode of operation, it is possible to interleave/cycle t2 and t4 to reduce the switching loss per switch, and can be implemented with full voltage reversal (t2 becomes t3, and t4 becomes W.

Figure 23:
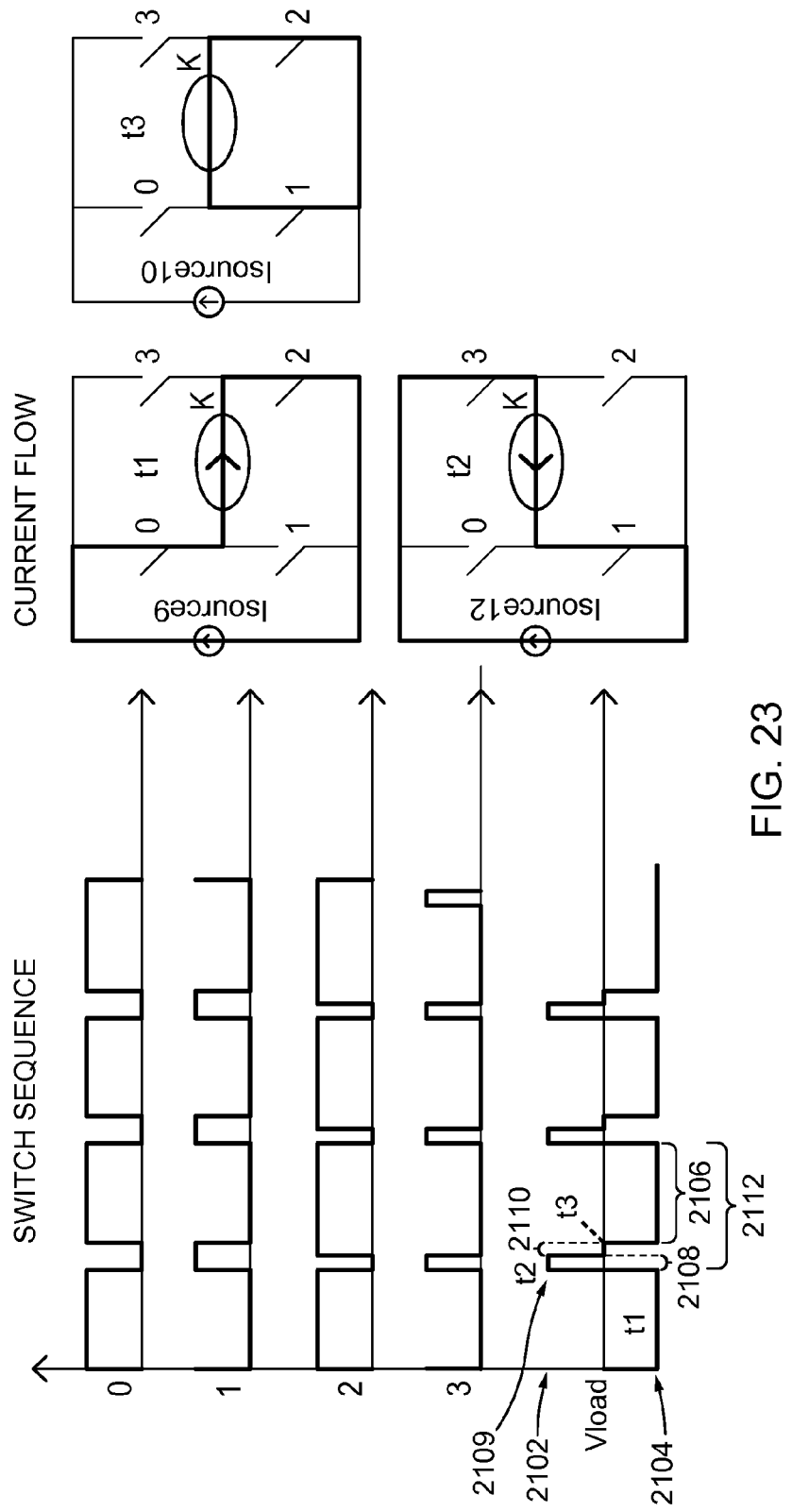
FIG. 23 is a switching sequence for a unipolar mode of operation with voltage reversal.

Referring next to FIG. 23 shown is a switching sequence for a unipolar mode of operation with voltage reversal, which may be utilized in connection with the chamber/electrode configuration depicted in FIG. 17. In this mode of operation, the addition of a reverse-potential 2109 helps to sweep charge, and when applied with a voltage level 2102 that is of sufficient magnitude, the reverse-potential 2109 reduces, and may prevent, deleterious nodule formation on a target(s).

In the context of ceramic targets, for example, nodule formation is almost always a concern. These nodules are typically oxide regions that are thought to be due to preferential sputtering of target materials that result from inclusions and insulative target regions. And the addition of oxygen to the process increases the likelihood of nodules. In solar film deposition, Aluminum doped zinc oxide (AZO) is particularly sensitive to nodule formation.

In addition, in order to avoid sputtering the chamber walls when the reverse-potential 2109 is at a high level, the reverse-potential 2109 may be applied for a duration 2108 that is relatively short. As depicted, a cycle 2112 of the exemplary waveform also includes a sputtering portion 2106 (during which sputtering occurs) and a recovery portion 2110 during which there is generally insufficient energy to support sputtering.

Figure 24:
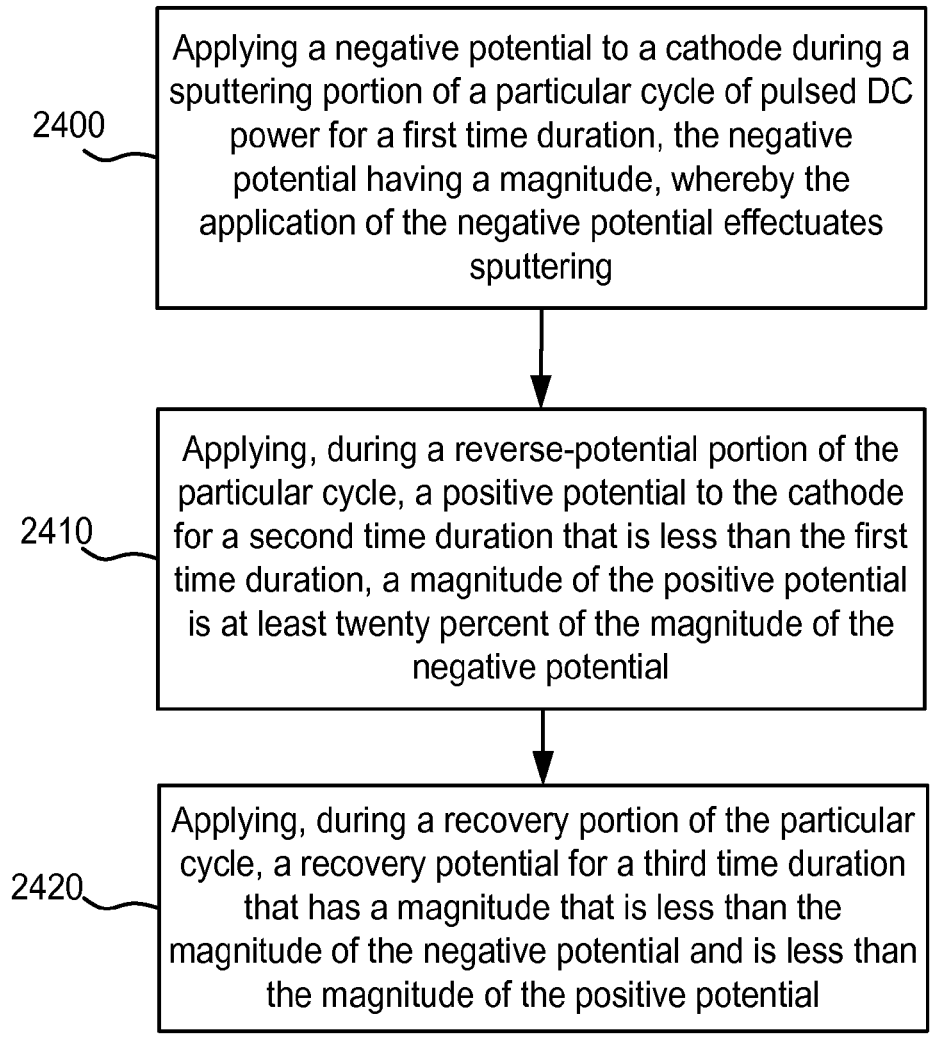
FIG. 24 is a flowchart depicting a method for applying power with a relatively high voltage reversal.

While referring to FIG. 23 simultaneous reference is made to FIG. 24, which is a flowchart depicting a method for applying power with a relatively high voltage reversal (e.g., to mitigate against nodule formation). As shown, a negative potential with a magnitude 2104 is applied to a cathode during a sputtering portion 2106 of a particular cycle 2112 of pulsed DC power for a first time duration. During this first time duration, the application of the sputtering portion 2106 of the pulsed power effectuates sputtering (Block 2400). Although the magnitude 2104 of the negative potential that is applied during the sputtering portion 2106 of the cycle 2112 certainly may vary, in many implementations a voltage at or between 500 or 600 Volts is an effective magnitude.

As shown, during a reverse-potential portion 2109 of the cycle 2112, a positive potential is applied to the cathode for a second time duration 2108 that is less than the first time duration of the sputtering portion 2106 of the cycle 2112. A magnitude 2102 of the positive potential that is applied during the reverse-potential portion 2109 of the cycle 2112 is at least twenty percent of the magnitude 2104 of the negative potential (Block 2410). For example, if the magnitude 2104 of the negative potential that is applied during the sputtering portion 2106 of the cycle 2112 is 500 Volts, the magnitude 2102 of the positive potential during the reverse-potential portion 2109 of the cycle 2112 is at least 100 Volts. In contrast, prior techniques for applying a reverse-potential (e.g., for charge clearing) applied a positive potential that was substantially less than twenty percent of the magnitude of a negative sputtering voltage.

In other modes of operation, the magnitude 2102 of the positive potential is at least thirty percent of the magnitude 2104 of the negative potential that is applied during the sputtering portion 2106 of the cycle. And in yet other implementations, good results have been achieved when the magnitude 2102 of the positive potential is one hundred percent of the magnitude 2104 of the negative potential that is applied during the sputtering portion 2106 of the cycle. For example, substantial if not complete reduction of nodule formation has been achieved when the positive potential during the reverse-potential portion 2109 of the cycle 2112 is at least 500 Volts and the negative potential that is applied during the sputtering portion 2106 of the cycle 2112 is 500 Volts.

As shown, during a recovery portion 2110 of the cycle 2112, a recovery potential is applied for a third time duration that has a magnitude that is less than the magnitude 2104 of the negative potential applied during the sputtering portion 2106 and is less than the magnitude 2102 of the positive potential that is applied during the reverse-potential portion 2109 of the cycle 2112 (Block 2420). Thus, the cycle 2112 of the exemplary waveform includes three portions: the sputtering portion 2106, the reverse-potential portion 2109 and the recovery portion 2110. Although it is contemplated that other potentials may be applied during the cycle 2112 (to create more than three portions during a cycle), it has been found that control over the duration of each of these three portions 2106, 2109, 2110 enables a level of process control that was previously unavailable.

For example, the duration of the sputtering portion 2106 may be changed to affect the sputtering rate, the duration of the reverse-potential portion 2109 may be adjusted as needed to reduce nodule formation, and the recovery portion 2110 may be adjusted to achieve one or more desired film properties. And as discussed previously herein, the overall duration (and hence frequency) of the cycle 2112 may be varied to achieve desired processing effects such as arc management, film properties, and sputtering rate. In general, the frequency of the cycle is typically between zero and 350 kHz, but frequencies around 150 kHz have been found to provide a reasonable balance of desired processing effects.

Although the relative durations of the each of these three portions 2106, 2109, 2110 is certainly adjustable, in general the combined duration of the reverse-potential portion 2109 and the recovery portion 2110 is less than fifty percent of the duration of the cycle 2112, and in some implementations the combined duration of the reverse-potential portion 2109 and the recovery portion 2110 is approximately ten percent of the duration of the cycle 2112. In terms of time, for example, the reverse-potential portion 2109 is typically between one and ten microseconds and the recovery time is typically between zero and 20 microseconds.

As depicted, the exemplary switch sequence only requires one on/off transition per switch per period. And it should be noted that it is possible to reduce switching loss by cycling the t3 clamp period between the 1-2 and 0-3 switch pairs as shown.

Figure 25:
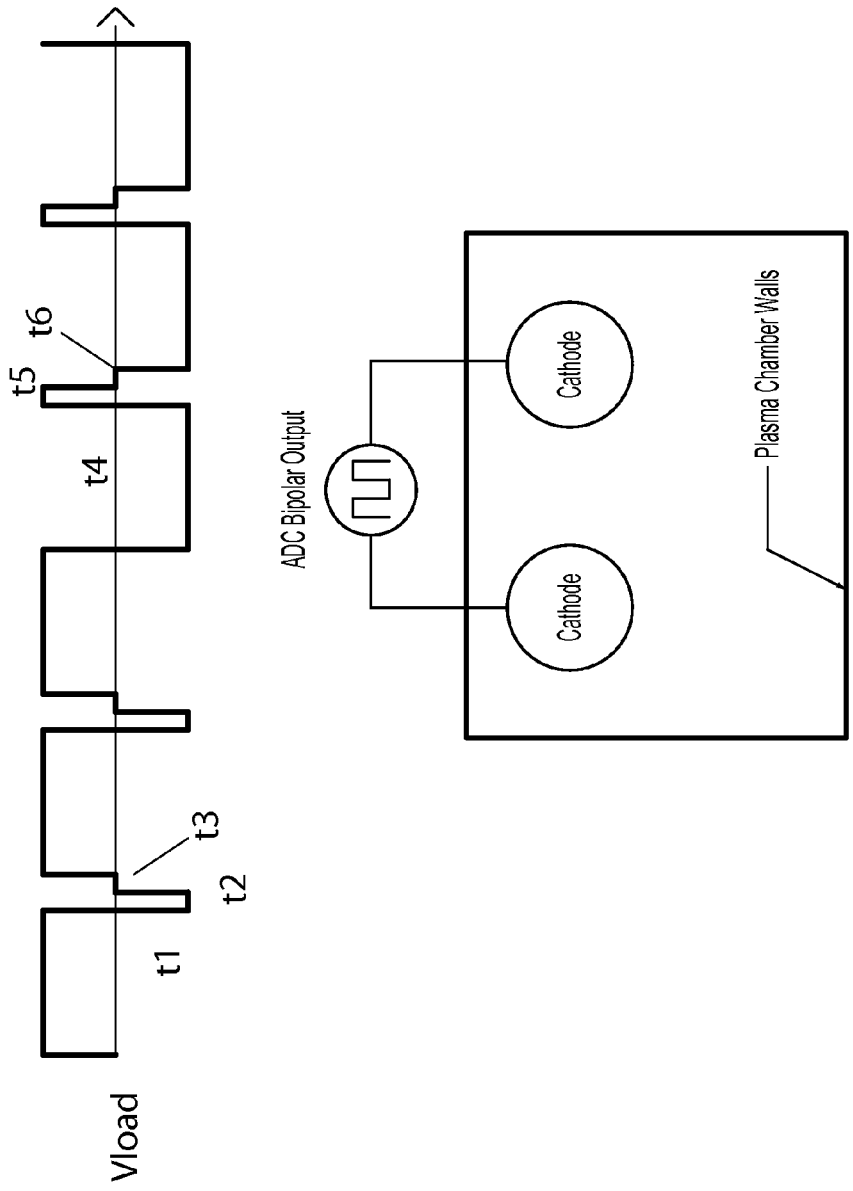
FIG. 25 is a diagram depicting a switching sequence associated with a bipolar pulsed packet mode of operation with a partial voltage reversal.

Referring next to FIG. 25, shown is a switching sequence associated with a bipolar pulsed packet mode of operation with a partial voltage reversal. In this mode of operation, there need not be any dedicated anodes because the polarity of the voltage applied to an electrode is reversed (so the electrode operates as a cathode and anode). As depicted, this waveform is a combination of the bipolar pulsed DC packet operation with partial voltage reversal during clamp.

Some embodiments relate to a computer storage product with a computer-readable medium (also referred to as a processor-readable medium) having instructions or computer code thereon for performing various computer-implemented operations. The media and computer code (also referred to as code) may be those specially designed and constructed for the specific purpose or purposes.

One of ordinary skill in the art will appreciate that embodiments described herein may be realized by a combination of hardware, firmware, software and a combination thereof. In some embodiments, non-transitory processor-readable media is utilized to store encoded instructions to effectuate processes described herein. Examples of processor-readable media include, but are not limited to: magnetic storage media such as hard disks, floppy disks, and magnetic tape; optical storage media such as Compact Disc/Digital Video Discs ("CD/DVDs"), Compact Disc-Read Only Memories ("CD-ROMs"), and holographic devices; magneto-optical storage media such as floptical disks; carrier wave signals; and hardware devices that are specially configured to store and execute program code, such as Application-Specific Integrated Circuits ("ASICs"), Programmable Logic Devices ("PLDs"), and ROM and RAM devices.

Examples of computer code include, but are not limited to, micro-code or micro-instructions, machine instructions, such as produced by a compiler, and files containing higher-level instructions that are executed by a computer using an interpreter. For example, an embodiment of the invention may be implemented using Java, C++, or other object-oriented programming language and development tools. Additional examples of computer code include, but are not limited to, control signals, encrypted code, and compressed code.

In conclusion, the disclosure describes, among other things, methods and apparatus for plasma-based sputtering deposition using a DC power. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention.

What is claimed is:

1. A method for applying pulsed DC power to a plasma processing chamber, the method comprising:
    applying a negative potential to a cathode during a sputtering portion of a particular cycle of the pulsed DC power for a first time duration, the negative potential having a magnitude, whereby the application of the negative potential effectuates sputtering;
    applying, during a reverse-potential portion of the particular cycle, a positive potential to the cathode for a second time duration that is less than the first time duration, a magnitude of the positive potential is the same as the magnitude of the negative potential; and
    applying, during a recovery portion of the particular cycle, a recovery potential for a third time duration that has a magnitude that is less than the magnitude of the negative potential and is less than the magnitude of the positive potential; wherein
    the sum of the second and third time durations is less than the first time duration;
    the sum of the second and third time durations is less than ten percent of the particular cycle; and
    the second duration is less than ten percent of the particular cycle and at least one microsecond.

2. The method of claim 1 wherein the second duration is less than 10 microseconds.

3. A power supply comprising:
    a power control component in communication a direct current power source and configured to direct the power to at least one electrode with an alternating polarity according to processor readable instructions; and
    a non-transitory, tangible computer readable storage medium, encoded with the processor readable instructions to perform a method for applying power, the method comprising:
    applying a negative potential to a cathode during a sputtering portion of a particular cycle of the pulsed DC power for a first time duration, the negative potential having a magnitude, whereby the application of the negative potential effectuates sputtering;
    applying, during a reverse-potential portion of the particular cycle, a positive potential to the cathode for a second time duration that is less than the first time duration, a magnitude of the positive potential is the same as the magnitude of the negative potential; and
    applying, during a recovery portion of the particular cycle, a recovery potential for a third time duration that has a magnitude that is less than the magnitude of the negative potential and is less than the magnitude of the positive potential; wherein
    the sum of the second and third time durations is less than the first time duration;
    the sum of the second and third time durations is less than ten percent of the particular cycle; and
    the second duration is less than ten percent of the particular cycle and at least one microsecond.

4. The power supply of claim 3, wherein the second duration is less than 10 microseconds.

* * * * *